(12) United States Patent
Ramadas et al.

(10) Patent No.: US 9,799,854 B2
(45) Date of Patent: Oct. 24, 2017

(54) MULTILAYER FILM FOR ENCAPSULATING OXYGEN AND/OR MOISTURE SENSITIVE ELECTRONIC DEVICES

(71) Applicant: Agency for Science, Technology and Research, Singapore (SG)

(72) Inventors: Senthil Kumar Ramadas, Singapore (SG); Soo Jin Chua, Singapore (SG); Lin Karen Ke, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 241 days.

(21) Appl. No.: 14/106,408

(22) Filed: Dec. 13, 2013

(65) Prior Publication Data

US 2014/0179040 A1    Jun. 26, 2014

Related U.S. Application Data

(62) Division of application No. 12/937,259, filed as application No. PCT/SG2009/000132 on Apr. 8, 2009.

(Continued)

(51) Int. Cl.
*B05D 5/12* (2006.01)
*H01L 51/56* (2006.01)
(Continued)

(52) U.S. Cl.
CPC .......... *H01L 51/56* (2013.01); *H01L 51/524* (2013.01); *H01L 51/5256* (2013.01);
(Continued)

(58) Field of Classification Search
USPC ........................................... 427/66
See application file for complete search history.

(56) References Cited

U.S. PATENT DOCUMENTS 3,510,371 A   5/1970   Frankson et al.
4,260,768 A   4/1981   Lorenz et al.
(Continued)

FOREIGN PATENT DOCUMENTS

EP    0776147 A1    5/1997
JP    2000305077 A   11/2000
(Continued)

OTHER PUBLICATIONS

Final Office Action Issued on Jun. 24, 2015 in U.S. Appl. No. 12/937,259 by Monique Jackson.
(Continued)

*Primary Examiner* — Austin Murata
(74) *Attorney, Agent, or Firm* — Hultquist, PLLC; Steven J. Hultquist

(57) ABSTRACT

The present invention relates to a multilayer barrier film capable of encapsulating a moisture and/or oxygen sensitive electronic or optoelectronic device, the barrier film including at least one nanostructured layer including reactive nanoparticles capable of interacting with moisture and/or oxygen, the reactive nanoparticles being distributed within a polymeric binder, and at least one ultraviolet light neutralizing layer comprising a material capable of absorbing ultraviolet light, thereby limiting the transmission of ultraviolet light through the barrier film.

2 Claims, 11 Drawing Sheets

Related U.S. Application Data

(60) Provisional application No. 61/043,534, filed on Apr. 9, 2008.

(51) Int. Cl.
*H05B 33/04* (2006.01)
*H05B 33/10* (2006.01)
*H01L 51/44* (2006.01)
*H01L 51/52* (2006.01)

(52) U.S. Cl.
CPC ......... *H01L 51/5259* (2013.01); *H05B 33/04* (2013.01); *H05B 33/10* (2013.01); *H01L 51/448* (2013.01); *H01L 51/5284* (2013.01); *H01L 2251/5369* (2013.01); *Y10T 428/24995* (2015.04); *Y10T 428/25* (2015.01); *Y10T 428/3154* (2015.04); *Y10T 428/31504* (2015.04); *Y10T 428/31507* (2015.04); *Y10T 428/31511* (2015.04); *Y10T 428/31533* (2015.04); *Y10T 428/31551* (2015.04); *Y10T 428/31663* (2015.04); *Y10T 428/31678* (2015.04); *Y10T 428/31721* (2015.04); *Y10T 428/31725* (2015.04); *Y10T 428/31931* (2015.04); *Y10T 428/31935* (2015.04); *Y10T 428/31938* (2015.04)

(56) References Cited

U.S. PATENT DOCUMENTS

| | | | |
|---|---|---|---|
| 5,916,685 A | 6/1999 | Frisk | |
| 6,465,953 B1 | 10/2002 | Duggal | |
| 6,466,355 B1 | 10/2002 | Berneth et al. | |
| 7,261,647 B2 | 8/2007 | Sullivan et al. | |
| 2003/0160935 A1* | 8/2003 | Lee | G02F 1/1341 349/187 |
| 2003/0170496 A1 | 9/2003 | Hieda et al. | |
| 2003/0203210 A1 | 10/2003 | Graff et al. | |
| 2004/0075380 A1 | 4/2004 | Takemoto et al. | |
| 2004/0245541 A1* | 12/2004 | Shitagaki | H01L 51/5237 257/103 |
| 2005/0110020 A1 | 5/2005 | Hayashi et al. | |
| 2005/0239294 A1* | 10/2005 | Rosenblum | B05D 1/60 438/778 |
| 2005/0249901 A1* | 11/2005 | Yializis | B32B 7/02 428/35.7 |
| 2006/0158111 A1 | 7/2006 | Hayashi | |
| 2006/0220549 A1 | 10/2006 | Kim et al. | |
| 2007/0013292 A1 | 1/2007 | Inoue et al. | |
| 2007/0172971 A1* | 7/2007 | Boroson | H01L 51/5246 438/26 |
| 2007/0182314 A1 | 8/2007 | Oh et al. | |
| 2008/0012477 A1* | 1/2008 | Koo | H05B 33/04 313/504 |
| 2010/0089636 A1 | 4/2010 | Ramadas et al. | |
| 2010/0294024 A1* | 11/2010 | Kumar | B82Y 30/00 73/38 |
| 2011/0132449 A1 | 6/2011 | Ramadas et al. | |

FOREIGN PATENT DOCUMENTS

| | | |
|---|---|---|
| KR | 10-0636497 B1 | 10/2006 |
| TW | 493359 B | 7/2002 |
| TW | 200420182 A | 10/2004 |
| TW | 200814393 A | 3/2008 |
| WO | 2006057492 A1 | 6/2006 |
| WO | 2008009929 A2 | 1/2008 |
| WO | 2008057045 A1 | 5/2008 |
| WO | 2008082362 A1 | 7/2008 |

OTHER PUBLICATIONS

Office Action Issued on Sep. 10, 2014 in U.S. Appl. No. 12/937,259 by Monique Jackson.
Office Action Issued on Dec. 16, 2013 in U.S. Appl. No. 12/937,259 by Monique Jackson.
Jun. 10, 2015 Office Action issued in corresponding Korean Patent Application No. 10-2010-7024937.
Chen, S., et al., "NanoGetters for MEMS Hermetic Packaging", "Proceedings of the 7th IEEE International on Conference Nanotechnology, Hong Kong", Aug. 2-5, 2007, pp. 921-924.
El-Sayed, M., "Some Interesting Properties of Metals Confined in Time and Nanometer Space of Different Shapes", "Accounts of Chemical Research", 2001, pp. 257-264, vol. 34, No. 4.
Gole, J., et al., "Unusual properties and reactivity at the nanoscale", "Journal of Physics and Chemistry of Solids", 2005, pp. 546-550, vol. 66.
Halme, J., "Dye-sensitized nanostructured and organic photovoltaic cells: technical review and preliminary tests", "Master's thesis, Helsinki Institute of Technology, Dept. of Engr. Physics and Mathematics", Feb. 12, 2002, pp. 1-115.
Kodama, R., et al., "Fast heating of ultrahigh-density plasma as a step towards laser fusion ignition", "Nature", Aug. 23, 2001, pp. 801-802 and Abstract, vol. 412.
Liu, X., et al., "Atomic Layer Deposition of Hafnium Oxide Thin Films From Tetrakis(dimethylamino)Hafnium (TDMAH) and Ozone", "D3.8.1, Mat. Res. Soc. Symp. Proc.", 2003, pp. 97-102, vol. 765.
Sommeling, P., et al., "Flexible Dye-Sensitized Nanocrystalline TiO2 Solar Cells", "EPSEC—16(European Photovoltaic Solar Energy Conference), Glasgow", May 1-5, 2000.
Dec. 27, 2012 Office Action issued in corresponding Taiwan Patent Application No. 098111862.
Wang, Z., et al., "Polyhedral Shapes of CeO2 Nanoparticles", "J. Phys. Chem. B.", 2003, pp. 13563-13566, vol. 107.

* cited by examiner

Process Sequence:

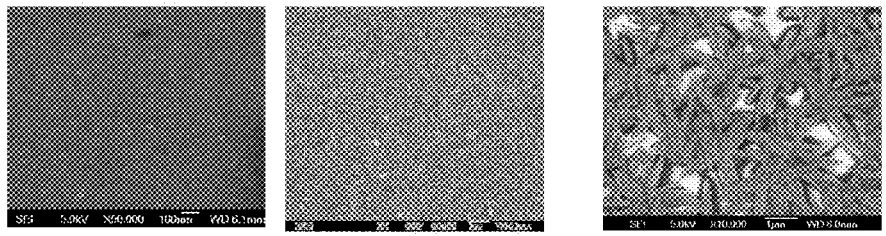
Fig. 10A
Zinc nanodots surface topography – SEM
50 x magnifications
Fig. 10B
Zinc nanorods – 10x magnification
Fig. 10C
Zinc rods dense nanostructure – SEM
10x Magnification
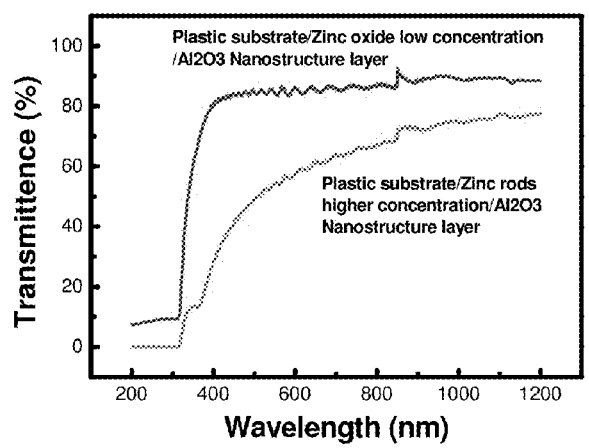
Fig. 11
UV absorption properties of UV light neutralizing films Vacuum sealing of the multilayer
Neutralizing layer and
Nanostructured layer on to the device Vacuum Sealed
Encapsulated organic device Flex test with flexible encapsulated OLED Bending cycles vs Luminescence

MULTILAYER FILM FOR ENCAPSULATING OXYGEN AND/OR MOISTURE SENSITIVE ELECTRONIC DEVICES

CROSS-REFERENCE TO RELATED APPLICATIONS

This application is divisional application under 35 U.S.C. §120 of U.S. patent application Ser. No. 12/937,259, which in turn is a U.S. national phase under 35 U.S.C. §371 of International Patent Application No. PCT/SG09/00132 filed Apr. 8, 2009, which in turn claims the benefit of priority of U.S. Provisional Patent Application No. 61/043,534 filed Apr. 9, 2008. The disclosures of U.S. patent application Ser. No. 12/937,259, International Patent Application No. PCT/SG09/00132, and U.S. Provisional Patent Application No. 61/043,534 are hereby incorporated herein by reference in their respective entireties, for all purposes.

FIELD OF THE INVENTION

The present invention relates generally to encapsulation technology, more particularly to multilayer films for encapsulating oxygen and/or moisture sensitive electronic devices.

BACKGROUND OF THE INVENTION

In recent years, plastic electronics has grown in importance in an increasing number of areas, particularly in display applications used in a wide range of consumer handheld electronic devices containing miniaturized display screens. The goal of achieving an all-polymer electronics device has motivated research groups around the world to provide plastics—which are known for their low-cost processing, flexibility and toughness—with the electronic properties needed for practical circuitry in a wide range of electronic devices.

Organic luminescent electronic devices (OLEDs) are one example of plastic electronic devices which have grown to become a promising technology for flat panel displays, relying on organic thin-films to produce light. The active layer in an OLED is a fluorescent organic material that emits light when an electrical current passes through it. The fluorescent organic material is also known as an electroluminescent (EL) element and is arranged between a transparent anode layer and a transparent cathode layer. It is known that the fluorescent organic material comprises organic molecules that are reactive towards moisture and oxygen, thus causing the EL element to degrade over time due to reaction with moisture and oxygen.

In order to protect the organic EL element from degradation, the organic EL element is typically enclosed within an encapsulation that seals off moisture and oxygen. Attempts have been made to provide various types of encapsulation structures that are resilient towards handling and effective in providing moisture and oxygen barrier. Conventional types of encapsulation, such as that described in European Patent Application No. 0 776 147 A1, involve placing the moisture and oxygen sensitive components within an enclosure defined between two substrates that have low gas permeation properties. The two substrates are held together by adhesives, with desiccants placed within the enclosure to absorb moisture and oxygen. In some instances, an inert gas such as nitrogen may be sealed within the enclosure.

Current efforts in encapsulation technology are focused on lowering the gas permeability of the base substrate on which the OLED is formed. For example, US Patent Application No. 20030203210 (Vitex Systems, Inc.) describes substrates that comprise alternating polymer and metal oxide inorganic layers placed on a supporting substrate. The metal oxide inorganic layers were found to demonstrate low permeability towards gases, and when used in an alternating layer arrangement, low gas permeation rates were achieved. However, inorganic metal oxide layers have an inherent structural problem in that surface defects such as pinholes and cracks are formed in the layer during fabrication. These surface defects provide a pathway for water and oxygen entry, thereby compromising the gas permeation properties of the encapsulation. Furthermore, metal oxide layers are prone to developing further structural defects when mechanical flexing stresses are applied.

U.S. Pat. No. 6,465,953 (General Electric Company) describes a transparent polymer substrate that is filled with moisture getter particles. The substrate is formed by adding moisture getter particles, such as BaO and MgO, to thermosetting polymers such as polycarbonate. The plastic substrate is coated with an additional inorganic film comprising $SiO^2$ or $Si3N^4$ to improve the barrier properties of the substrate.

Other than improvements to the base substrate, alternative approaches to improving the bas barrier properties of the encapsulation are seldom explored. In order to achieve devices lifetimes of above 30,000 hours, current efforts in encapsulation technology are still focused on designing barrier substrates that can achieve low water vapour permeation rates of $10^{-5}$ g/cm$^2$/day or less.

An object of the present invention is to provide a flexible multilayer barrier film capable of encapsulating a moisture and oxygen sensitive electronic device which can be used in conjunction with any existing encapsulation design.

SUMMARY OF THE INVENTION

In one aspect, a flexible multilayer barrier film capable of encapsulating a moisture and/or oxygen sensitive electronic device is provided. The multilayer film comprises at least one polymeric layer having distributed therein reactive nanoparticles capable of interacting with moisture and/or oxygen, the polymeric layer being derived from at least one polymerizable monomer that is polymerized through the application of an external curing factor. The multilayer film also comprises an ultraviolet light neutralizing layer comprising a material capable of absorbing ultraviolet light, thereby shielding the electronic device to be encapsulated from exposure to the ultraviolet light.

The present inventors have found that "multilayer barrier films" (referred to herein also as "barrier films") in which reactive nanoparticles are distributed in a polymeric binder to form one or more nanostructured (or nanoparticulate) layers are highly effectively for encapsulating moisture and oxygen sensitive devices. They are also useful for improving the gas barrier properties of existing barrier materials. Although moisture gettering nanoparticles have been used in barrier substrates, they have hitherto not been used as a coating or film. Conventional barrier substrates are capable of achieving low gas permeability with the use of metal or metal oxide barrier layers. However, it is found that metal and metal oxide layers gradually become opaque due to oxidation by permeating moisture and oxygen, thereby destroying the transparency of the barrier substrate. In order to avoid such a problem, attempts have been made to replace the metal or metal oxide barrier layer altogether in the barrier substrate. By avoiding the use of the metal or metal oxide film, and using a nanostructured layer containing reactive nanoparticles instead, the present invention overcomes the problem of the barrier substrate degenerating with use. In this regard, it is noted that the approach of using nanostructured layers as replacements for inorganic layer barrier substrates has so far been discouraged since the polymeric binder for holding the nanoparticles are cured through the application of a curing factor, such as ultraviolet light. As the organic electroluminescent (EL) layers of such devices are highly sensitive to ultraviolet light radiation, the curing process is likely to damage the organic EL layers. In conventional barrier substrates, such a problem does not occur as the ultraviolet light is prevented from reaching the device by the metal or metal oxide inorganic layers. In the absence of these inorganic layers, the EL layers are inevitably exposed to the ultraviolet light radiation. This problem is overcome in the present invention by combining the moisture and oxygen scavenging ability of the nanostructured layer(s) with the ultraviolet light shielding capability of the ultraviolet light neutralizing layer, to provide a purely "organic" barrier film in which inorganic metal and metal oxide layers found in conventional barrier substrates are omitted.

In the context of this application, a "nanostructured layer" refers generally to a layer in which nanoscale particles are distributed. The layer may comprise any suitable sort of binder for holding the nanoscale particles, such as pure polymers, polymer solutions and polymer composites. The term "reactive nanoparticles" refers to nanoparticles capable of interacting with moisture and/or oxygen, either by way of chemical reaction (e.g. hydrolysis or oxidation), or through physical or physico-chemical interaction (e.g. capillary action, adsorption, hydrophilic attraction, or any other non-covalent interaction between the nanoparticles and water/oxygen) to bring about the removal of moisture and oxygen from the gas permeating the encapsulation, thus preventing them from reaching the electronic component.

Reactive nanoparticles may comprise or consist of metals which are reactive towards water and/or oxygen, i.e. metals which are above hydrogen in the reactivity series, including metals from Group 2 to 14 (IUPAC) may be used. Some preferred metals include those from Groups 2, 4, 10, 12, 13 and 14. For example, these metals may be selected from Al, Mg, Ba and Ca. Reactive transition metals may also be used, including Ti, Zn, Sn, Ni, and Fe for instance.

Other than metals, reactive nanoparticles may also comprise or consist of certain metal oxides which are capable of interacting with moisture and/or oxygen, including $TiO_2$, $Al_2O_3$, $ZrO_2$, ZnO, BaO, SrO, CaO and MgO, $VO_2$, $CrO_2$, $MoO_2$, and $LiMn_2O_4$. In certain embodiments, the metal oxide may comprise a transparent conductive metal oxide selected from the group consisting of cadmium stannate ($Cd_2SnO_4$), cadmium indate ($CdIn_2O_4$), zinc stannate ($Zn_2SnO_4$ and $ZnSnO_3$), and zinc indium oxide ($Zn_2In_2O_5$).

It is evident for a person skilled in the art that the reactivity of a substance may depend on the particle size of the substance (see J. Phys. Chem. Solids 66 (2005) 546-550). For example, $Al_2O_3$ and $TiO_2$ are reactive towards moisture in the form of nanoparticles but are unreactive or reactive only to a very small extent in the (continuous) bulk phase several orders of magnitude above the nanoscale, such as a microscale or millimeter scale barrier film which is beyond the nanoscale dimension of several nanometers to several hundred nanometers typically associated with nanoparticles. Accordingly, using Al2O3 and TiO2 as illustrative examples, $Al_2O_3$ and $TiO_2$ nanoparticles are considered to be reactive towards moisture, whereas $Al_2O_3$ and $TiO_2$ bulk layers (such as those used in barrier substrates) are not reactive towards moisture and oxygen. In general, reactive metal or metal oxide nanoparticles, for example $Al_2O_3$, $TiO_2$ or ZnO nanoparticles, may be present in suitable colloidal dispersions for the preservation of reactivity and may be synthesized via any conventional or proprietary method such as the NanoArc® method from Nanophase Technologies Corporation.

In one embodiment, reactive nanoparticles in the nanostructured layer comprise or consist of carbon nanoparticles, such as carbon nanotubes, nanoribbons, nanofibers and any regular or irregular shaped carbon particles with nanoscale dimensions. For carbon nanotubes, single-walled or multi-walled carbon nanotubes may be used. In a study carried out by the present inventors, it was found that carbon nanotubes (CNTs) can serve as a desiccant. Carbon nanotubes can be wetted by low surface tension liquids via capillary action, particularly liquids whose surface tension does not exceed about 200 $Nm^{-1}$ (Nature, page 801, Vol. 412, 2001). In principle, this would mean that water molecules can be drawn into open-ended carbon nanotubes by capillary suction. It is suggested that water molecules may form quasi-one-dimensional structures within carbon nanotubes, thereby helping to absorb and retain a small volume of oxygen and water molecules.

Inert nanoparticles may be included in the nanostructured layer, present in conjunction with reactive nanoparticles. As used herein, "inert nanoparticles" refer to nanoparticles which do not interact at all with moisture and/or oxygen, or which react to a small extent as compared to reactive nanoparticles. Such nanoparticles may be included into the nanostructured layer to obstruct the permeation of oxygen and/or moisture. Examples of inert particles include nanoclays as described in U.S. Pat. No. 5,916,685. Such nanoparticles serve to plug the defects in the barrier layer, thereby obstructing the path through which permeation takes place, or at least reducing the defect cross-sectional area, thus rendering permeation pathways by which water vapor or oxygen diffuses through the defect much more tortuous, thus leading to longer permeation time before the barrier layer is breached and thereby improving barrier properties.

Other suitable materials for inert nanoparticles may also include unreactive metals such as copper, platinum, gold and silver; minerals or clays such as silica, wollastonite, mullite, monmorillonite; rare earth elements, silicate glass, fluorosilicate glass, fluoroborosilicate glass, aluminosilicate glass, calcium silicate glass, calcium aluminium silicate glass, calcium aluminium fluorosilicate glass, titanium carbide, zirconium carbide, zirconium nitride, silicon carbide, or silicon nitride, metal sulfides, and a mixture or combination thereof. Encapsulation barrier films which comprise nanostructured layers having only inert nanoparticles, such as nanoclay particles, do not belong to the invention.

Without wishing to be bound by theory, the inventors believe that strong barrier properties can be achieved by using a combination of different types of nanoparticles. Thus, the nanostructured layer can comprise at least two types of nanoparticles. By studying the absorption/reaction characteristics of different types of nanoparticles, it is possible to select a combination of nanoparticles which compliment each other to achieve barrier effects that are stronger than that which is possible with a single type of material. For example, different types of reactive nanoparticles may be used in the polymeric layer, or a combination of reactive and inert nanoparticles may be used.

In accordance with the above, the nanostructured layer may comprise a combination of carbon nanotubes and metal and/or metal oxide nanoparticles. One exemplary embodiment is directed to the inclusion of both metal oxide nanoparticles such as $TiO_2/Al_2O_3$ as well as carbon nanotubes. Any combination of such nanoparticles may be used and optimized accordingly using regular experimentation. In an exemplary embodiment, the quantity of metal oxide nanoparticles present is between 500 to 15000 times (by weight) the quantity of carbon nanotubes. For oxides of metals having low atomic weight, lower ratios can be used. For example, $TiO_2$ nanoparticles can be used in combination with carbon nanotubes, with the weight ratio of carbon nanotubes to $TiO_2$ being between about 1:10 to about 1:5, but not limited thereto.

The concentration of nanoparticles in the nanostructured layer can be varied according to the desired level of barrier properties in the encapsulation. It is theoretically advantageous to employ a high concentration of nanoparticles in the nanostructured layer order to increase the water and/or oxygen scavenging capacity of the barrier film. However, in the context of display applications, an upper limit to particle concentration is imposed by optical requirements of the barrier film. For example, beyond an upper threshold concentration, nanoparticle agglomeration is known to take place because of the tendency of nanoparticles to decrease their exposed surface through clustering so that their surface energy is reduced (see J. Phys. Chem. B, 2003, Vol. 107, 13563-13566). Agglomeration results in the formation of large clusters of nanoparticles which causes light scattering through the barrier film, and is therefore undesirable. In order to achieve a balance between moisture gettering capability and optical quality, it is possible to adjust the concentration of nanoparticles used accordingly. In one embodiment, the amount of nanoparticles added to a monomer solution for forming the nanostructured layer is in the range of about 0.0000001%, about 0.0001%, about 0.001%, about 0.01%, about 0.1%, or about 1.0% to about 10, 20, 30, 40 or 50% by volume of the by weight of the monomer present in the polymeric binder. In other embodiments the amount of nanoparticles added to a monomer solution for forming the nanostructured layer is to about 10%, about 20%, about 30% or about 40% by volume to the weight of the monomer present in the polymeric binder. In the case of carbon nanotubes, they may be also used in quantities from about 0.01% to about 10%, about 20%, about 30%, about 40% or about 50% by weight of the monomer present. In one illustrative embodiment carbon nanotubes are added in quantities of about 0.01% to about 10% by volume to the weight of the monomer present.

In order to prevent light scattering through the multilayer film, the size of individual nanoparticles may also be designed to be smaller than the characteristic wavelength of light emitted by the device. The characteristic wavelength is defined as the wavelength at which the peak intensity of the light spectrum occurs. When the barrier film is designed for organic light emitting diode (OLED), transparent organic light emitting diode (TOLED) or see-through displays, the size of the getter particles is preferably less than ½, and preferably less than ⅕, of the characteristic wavelength, which correspond to particle sizes of less than 200 nm and preferably less than 100 nm. However, for other types of applications, larger particles may be desirable to achieve a deliberate scattering of light, for example in liquid crystal displays, polarizers and film negatives.

The nanoparticles may be present in one uniform shape or it may be formed in two or more shapes. It may be advantageous to use nanoparticles of different shapes and sizes in order to customize the packing density of nanoparticles in the multilayer barrier film to achieve effective isolation of the electronic component. For example, in order to provide efficient interaction between the reactive nanoparticles and the water vapor/oxygen permeating the barrier layer, the nanoparticles may have suitable shapes that would maximize the surface area that can come into contact with the water vapor and oxygen. This means that the nanoparticles may be designed to have a large surface area to volume ratio, or surface area to weight ratio. In one example, the nanoparticles have a surface area to weight ratio of between about 1 $m^2/g$ to about 50 or 100 or 200 $m^2/g$. This requirement can be achieved by using nanoparticles with different shapes, such as 2, 3 or more different shapes as described above. Possible shapes that the nanoparticles can assume include spherical shapes, rod shapes, elliptical shapes or any irregular shapes. In the case of rod shaped nanoparticles, they may have a diameter of between about 10 nm to 50 nm, a length of 50 to 400 nm, and an aspect ratio of more than 5, but not limited thereto.

The nanostructured layer includes a polymeric binder in which moisture and oxygen reactive nanoparticles are distributed. The polymeric binder may be obtained from any suitable polymerizable compounds (precursor) having at least one polymerizable group. Examples of polymerizable compounds suitable for this purpose include, but are not limited to, polyacrylate, polyacrylamide, polyepoxide, parylene, polysiloxanes, polyurethane and epoxies, or any other polymer, and may be derived from their corresponding monomer compounds. If adhesion between 2 successive nanostructured layers is desired, or if it is desired to adhere the barrier film onto a substrate, polymers with good adhesive quality may be chosen. The nanostructured layer may be formed by conventional polymer coating techniques, the barrier with a dispersion containing nanoparticles mixed with a monomer solution, e.g. an unsaturated organic compound having at least one polymerizable group. Thickness of the polymeric layer comprising binder with distributed nanoparticles therein can be in the range of about 2 nm to about several micrometers.

In one exemplary embodiment, the nanostructured layer containing the nanoparticles that are capable of interacting with moisture and/or oxygen is derived from ultra-violet (UV) light curable monomers. The advantage of using UV curable monomers is that curing time is almost instantaneous and nanostructured layers obtained thereof have excellent chemical resistance. Examples of UV light curable monomers include polyfunctional monomers, such as di- or tri-functional monomers. Suitable examples of such polyfunctional monomers include, without limitation, alkylenediol di(meth)acrylates such as 1,6-hexanediol diacrylate and neopentyl glycol diacrylate, cyclohexanedimethylol diacrylate, polyalkylene glycol di(meth)acrylates such as triethyiene glycol diacrylate, ether modified monomers such as propoxylated neopentyl glycol diacrylate, and higher functionality monomers such as trimethylolpropane triacrylate, trimethylolethane triacrylate, and pentaerythritol tetracrylate, and so on, as well as combinations of such polyfunctional monomers. Apart from UV-curable monomers, other types of monomers that can be polymerized through exposure to standard halogen light curing units may be used as well. For example, polymers that can be cured through exposure to light from blue superbright light emitting diodes at a wavelength of 400 nm and above may also be used.

For UV curable monomers, in order to accelerate the curing of the nanostructured layer, a photo-initiator may be included into the precursor mixture containing the monomers. Examples of suitable photo-initiators include, without limitation, benzoin ethers such as benzoin methyl ether, benzoin ethyl ether, benzoin phenyl ether, and so on; alkylbenzoins such as methylbenzoin, ethylbenzoin, and so on; benzyl derivatives including benzyldimethylketal; 2,4,5-triarylimidazole dimers including 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, and so on; acridine derivatives such as 9-phenylacridine and 1,7-bis(9,9'-acridinyl)heptane; N-phenylglycine; aromatic ketones such as trimethylbenzophenone, isopropylthioxanthone, benzophenone, 2-chloro and 2-ethyl-thioxanthone, 2,2-dimethoxy-2-phenylacetophenone, 2,2-diethoxyacetophenone, 2-hydroxy-2-methyl-1-phenyl-propanone, oligo-[2-hydroxy-2-methyl-1-[4-(1-methylvinyl)phenyl]propanone, 1-hydroxycyclohexyl-acetophenone, and 2-ethyl-hydroquinone; phosphine oxides, such as 2,4,6-trimethylbenzoyldiphenylphosphine oxide, and combinations thereof.

The ultraviolet (UV) light neutralizing layer comprises a layer of material capable of filtering UV light. Such materials may include inorganic as well as organic materials, for example protective coatings which include titanium oxide and zinc oxide nanoparticles, and chemical compounds that are able to absorb the UV rays. Exemplary UV filter material include, but are not limited to, oxides such hafnium dioxide ($HfO_2$), magnesium oxide (MgO) or barium oxide (BaO) all of which can provide low refractive oxide optical films. Titanium dioxide ($TiO_2$), tantalum oxide ($Ta_2O_5$), silicone oxide ($SiO_2$), zirconium oxide ($ZrO_2$), indium tin oxide (ITO), and zinc oxide (ZnO) nanoparticles may also be used. Indium tin oxide (ITO), and zinc oxide (ZnO) are examples of materials that provide high refractive oxide optical films. All of these mentioned metal oxides may be incorporated within the UV light neutralizing layer (such as an epoxy adhesive layer) serving to absorb, reflect and scatter incident UV thereby preventing the UV from reaching the electronic component. Further suitable materials that be used as UV filtering material include inorganic halides such as magnesium fluoride ($MgF_2$) or barium fluoride ($BaF_2$). In some embodiments, hafnium dioxide (hafnia) may be combined in multilayers with silicon dioxide to obtain hard, scratch-free, dense and adherent coatings. In addition, it is also possible to use organic materials such as carbon nanotubes as UV absorbing material.

Alternatively or in addition, chemical coatings which absorb incident UV and radiate it in a secondary form of energy may also be used in place of or in conjunction with physical coatings. In one embodiment, the UV neutralizing layer comprises a layer of UV light absorber material. Examples include 4-Methylbenzylidene camphor and benzotriazole. Another compound that can be used is 2-ethyl-hexyl methoxy cinnamate, which uses incident UV to bring about cis-trans photo isomerization of the compound.

In one exemplary embodiment, the UV neutralizing layer comprises copolymerizable benzotriazole compounds such as those disclosed in U.S. Pat. No. 4,260,768. Due to the availability of an unsaturated double bond in such compounds, contributed by side chains comprising acryloyl and methacryloyl radicals for example, such compounds can be advantageously copolymerized with the above-mentioned monomers that are used to form the UV neutralizing layer, thereby adding an additional layer of UV protection.

In some embodiments optical films may be provided to improve the quality of light emitted by the electronic component, or to improve the operation of the electronic component. These include polarizing films, visual field expanding films, phase contrast films, anti-reflection film, light reflection film, etc. For example, polyvinyl alcohol (PVOH) film may be included as a polarizing layer. Phase contrast films may be included to compensate the phase difference in polarized light generated in the liquid crystal layer by providing phase contrast to the light polarized by the polarizing plate so that a more distinct contrast can be established. The phase contrast film may be produced using a monoaxially oriented polycarbonate (PC) film, for example.

In some illustrative embodiments of the barrier film described herein, the nanostructured layer includes aluminum oxide, titanium oxide or a mixture of aluminum oxide and titanium oxide as nanoparticles able to interact/react with moisture and/or oxygen. In some other illustrative embodiments, the nanoparticulate material in the nanostructured layer includes (either together with aluminum oxide and/or titanium oxide) aluminum, CaO, MgO or other suitable nanoparticles. It is also possible to include (alone or in admixture with the above-mentioned materials) zinc oxide into the nanostructured layer for maximization of the UV filtering efficiency of the multilayer barrier film. The (separate) UV light neutralizing layer may include in all these illustrative embodiments zinc oxide as UV light filtering material. The zinc oxide can be present in any suitable morphology, for example as nanodots or nanorods (see Examples). In one illustrative example (see also the Example Section), the nanostructured film includes aluminum oxide nanoparticles, titanium oxide nanoparticles or a mixture thereof and the UV light neutralizing layer includes zinc oxide nanoparticulate material.

For certain applications which require the encapsulation barrier film to have good mechanical strength, a substrate may be provided to support the multilayer barrier film of the invention. The substrate may be flexible or rigid. The substrate may comprise any suitable variety of materials such as polyacetate, polypropylene, polyimide, cellophane, poly(l-trimethylsilyl-1-propyne), poly(ethylene-2,6-naphthalene dicarboxylate) (PEN), polyethylene terephthalate) (PET), poly(4-methyl-2-pentyne), polyimide, polycarbonate (PC), polyethylene, polyethersulfone, epoxy resins, polyethylene terephthalate, polystyrene, polyurethane, polyacrylate, polyacrylamide, polydimethylphenylene oxide, styrene-divinylbenzene copolymers, polyvinylidene fluoride (PVDF), nylon, nitrocellulose, cellulose, glass, indium tin oxide, nano-clays, silicones, polydimethylsiloxanes, biscyclopentadienyl iron, or polyphosphazenes, to name some illustrative examples. The base substrate may be arranged to face the external environment and or it may face the encapsulated environment. In food packaging, the substrate may face the internal surface that is in contact with food while the encapsulation barrier film forms the external surface in contact with atmospheric conditions.

In order to protect the multilayer barrier film from mechanical damage, the multilayer barrier film may be capped or overlaid with a terminal protective layer. The terminal layer may comprise any material having good mechanical strength and is scratch resistant. In one embodiment, the terminal layer comprises an acrylic film having distributed therein LiF and/or $MgF_2$ particles.

In OLED applications, the multilayer barrier film may be laminated over any part of an encapsulation for isolating the active component of the OLED device. In one embodiment, the encapsulation barrier film is used to form a base substrate for supporting the reactive layers of the electroluminescent component. In a rim-sealing structure, the encapsulation barrier film may be used to form a rigid cover that is arranged over the reactive layers of the electroluminescent component. The rigid cover may be attached to the base substrate by means of an adhesive layer, the adhesive layer being arranged at least substantially along the edge of the cover substrate for forming an enclosure around the reactive component. In order to minimize lateral diffusion of oxygen/moisture into the enclosure containing the reactive component, the width of the covering layer or the adhesive layer may be made larger than the thickness of the encapsulation barrier film.

In order to further reduce the permeation of moisture and/or oxygen through the encapsulation and to provide additional mechanical protection for the encapsulated electronic device, further encapsulation structures may be placed over the barrier film. For example, cover substrates may be arranged onto the barrier film. The cover substrate may also be selected from either a hard or flexible but scratch resistant material that can withstand minor impact forces and thus prevent reduce physical damage to the barrier film and/or the electronic component. Examples of materials that can be used include polyethylene (PET), polypropylene (PP), polycarbonate, glass, indium tin oxide, and transparent plastics. The cover may be attached onto the multilayer thin-film encapsulation via a layer of adhesive, thereby sandwiching the electronic component against the substrate.

In another embodiment, the barrier film is used to form a flexible encapsulating layer which seals the electroluminescent component against the base substrate. In this case, such an encapsulating layer may wrap around the surface of the electroluminescent component to form a 'proximal encapsulation'. The shape of the encapsulating layer thus conforms to the shape of the reactive component, leaving no gap between the electroluminescent component to be encapsulated and the encapsulating layer.

In one embodiment, the barrier film is arranged such that the nanostructured layer forms the innermost layer and is arranged adjacent to the electronic component and/or the sensor without having direct contact to the electronic component and/or the sensor, while a barrier substrate having low moisture and/or oxygen permeability forms the outermost layer, and the material capable of filtering ultra-violet light forms the intermediate layer arranged between the barrier substrate and the nanostructured layer.

The base substrate supporting the electronic component and the gas permeation sensor can comprise any durable material, which are optionally coated with single or multiple transparent metal oxide layers serving as barrier substrates. The multi-layer oxide films normally consist of multiple layers of organic and inorganic thin barrier films. Organic coatings, such as acrylics may be used as a sandwich layers between the two barrier oxide substrates. The high barrier substrates can be referred hereinafter as barrier stacks. The substrates can be made of high barrier transparent metal oxide coated polymer films for organic light emitting device/diode (OLED) application. The barrier stack substrates can be transparent or non-transparent and can be cut into any preferred dimensions.

The substrate supporting the electronic component and sensor may comprise a polymeric material, including organic polymers such as polycarbonate, polyethylene, polyethersulfone, epoxy resins, polyethylene terephthalate, polystyrenes, polyurethanes and polyacrylates. It may also comprise inorganic polymers such as silicones, polydimethylsiloxanes, biscyclopentadienyl iron, polydichlorophosphazene and derivatives thereof.

The barrier film may also be laminated over any existing barrier substrate, such as packaging materials for food and drinks, to improve their existing barrier properties.

Barrier substrates which are known in the art can comprise inorganic or organic materials. Inorganic materials that are particularly suitable include metals (e.g. aluminum, iron, tin), metal oxides (e.g. $Al_2O_3$, MgO, $TiO_2$), ceramic oxides, inorganic polymers, organic polymers and mixtures and combinations thereof. Examples of respective inorganic polymers include organic-inorganic polymers, metal chelate coordination polymers, and completely nitrogen based inorganic polymers. Specific examples are glass, silicones, polydimethylsiloxanes, biscyclopentadienyl iron, polydichlorophosphazene and derivatives thereof, for example. Suitable organic materials include organic polymers such as acrylic-based polymers, polyimide, epoxy resins, polyalkylenes derivatives such as crosslinked polyethylene, polyethylene terephthalate, polystyrenes, polyurethanes, polyacrylates, polycarbonates, and polyethersulfones. Particularly suitable organic polymers having a suitable level of permeability and stability include PET, polycarbonate and polyethersulfone.

In a preferred embodiment, the multilayer barrier film is used to encapsulate electroluminescent electronic components comprising moisture and/or oxygen sensitive reactive layers, wherein the electroluminescent component is encapsulated within the encapsulation. Accordingly, the present invention is applicable to both rigid and flexible encapsulation structures used to encapsulate any article that may be damaged from exposure to moisture and/or oxygen.

Although reference may be made to the encapsulation of OLEDs throughout the description, it is to be understood that the present invention is applicable for any encapsulated object or device, including electronic components. Some examples of electronic components include passive and active Organic Light Emitting Devices (OLEDs), charged-coupled devices (CCDs), micro-electro-mechanical sensors (MEMS), thinfilm transistors (TFT), and organic or inorganic photovoltaic devices based on a thin film solar cell including but not limited to a $Cu(InGa)Se_2$ solar cell, a Dye-sensitized solar cell (DSSC), a CdS/CdTe solar cell, a Copper-Indium Selenide solar cell (CIS) and a copper indium/gallium diselenide solar cell (CIGS).

In context with photovoltaic devices, such as solar cells that can include a barrier film of the invention it is noted that the current market is being driven by the inherent advantages of Thin Film Photovoltaics (TFPV includes CIGS, CdTe, DSSC technologies) including low cost, low weight, and the ability to manufacture them on flexible substrates and embed solar power capabilities into walls, roofs and even windows Unlike more conventional photovoltaics (PV) that uses crystalline silicon, TFPV also has the ability to operate under low light conditions. By contrast TFPV can be manufactured using simple printing or other roll-to-roll (R2R) machines using flexible barrier substrates and flexible encapsulation methods. The currently used encapsulation methods do not provide sufficient barrier properties and therefore, the life time of flexible PVs is estimated only 2 to 3 years life time. For example, current DSSC photovoltaic devices are highly sensitive to oxygen and moisture. The indium tin oxide, electrolyte and sensitizing dye of the devices are sensitive with water vapor and oxygen. The expected barrier properties which need to be provided by a barrier film and encapsulation packages for such devices are $10^{-5}$ g/m2/day at ambient conditions.

Such a dye solar cell (e.g. a DSSC) is based on the mechanism of a regenerative photo-electrochemical process. The active layer consists of a highly porous nano-crystalline titanium dioxide (nc-$TiO_2$) deposited on a transparent electrically conducting substrate. A monomolecular layer of a sensitizing dye on the nc-$TiO_2$ surface absorbs the incoming light. The device is completed by a counter-electrode comprising a thin platinum catalyst. The two electrodes are sealed to ensure confinement of the electrolyte containing the iodide/triiodide redox couple.

The breakthrough for a solar-to-electric energy conversion efficiency of 10% is the highly porous $TiO_2$ layer consisting of a network of interconnected nano-particles. The diameter of the $TiO_2$ particles is between 10 and 30 nm, depending on the preparation method. Compared to a flat surface, the total area is more than a 1000 times bigger. The adsorption of a monolayer of sensitizer and the use of a suitable electrolyte lead to a conversion of light into electricity with a quantum yield close to unity over a wide range of the visible spectrum. Charge separation occurs on an extremely fast timescale when the excited electron of the dye gets injected into the semiconductor. The surface of the counter electrode is modified with a minimal amount of platinum catalyst in order to reduce the overvoltage for the tri-iodide reduction.

Thus, in another aspect the present invention is directed to an encapsulated photovoltaic device which is sandwiched between two multilayer barrier films according to the present invention for protecting the photovoltaic device from moisture and/or oxygen. The meaning of the term "sandwiched" can be explained with reference to FIG. 14.

"Sandwiched" means in the context of the present invention that an oxygen sensitive electronic or optoelectronic device is tightly inserted between two opposing multilayer barrier films. With reference to FIG. 14, the photovoltaic device 221 is inserted between the layers 203, 202 at the top and the bottom of said photovoltaic device 221. In one aspect of the present invention it also means that a sandwiched device leaves the lateral sides (right and left side as illustrated in FIG. 14) of the device uncovered while the top and bottom side are sandwiched between two layers as shown in FIG. 14.

The multilayer films in this encapsulated photovoltaic device comprise a nanostructured layer which is attached to the photovoltaic device on one side and to an ultraviolet light neutralizing layer on an opposing side (these can also be referred to as top and bottom side). The lateral sides of the photovoltaic device which are not attached to the multilayer films are attached to a backing structure. This backing structure comprises or consists of a nanostructured layer or a nanostructured layer and an adhesive layer. In one embodiment, the backing structure comprises a nanostructured layer sandwiched between two adhesive layers. The backing structure also connects the two multilayer films between which the photovoltaic device is sandwiched. In one example multiple photovoltaic devices are combined in a photovoltaic device panel wherein the photovoltaic devices in the panel are separated from each other by the backing structure (see e.g. FIG. 14).

In accordance with another aspect of the invention, a system for fabricating an encapsulated device with integrated gas permeation sensor in accordance with the first embodiment of the invention is provided. The system comprises a vacuum chamber, a holding jig arranged within the vacuum chamber. The vacuum environment is used to carry out the fabrication of the gas permeation sensor. A first material source may be provided within the vacuum environment to form a gas permeation sensor on a sample base substrate, and a second material source may likewise be provided within the vacuum environment to form an encapsulation over the sensor and the electronic component. Alternatively, the fabrication of the electronic component or the encapsulation process may be carried out at separate stages outside of the vacuum chamber.

In one embodiment, the vacuum chamber comprises a plurality of serially connected sub-chambers for carrying out an in-line fabrication process. Due to space constraints imposed by the different equipment needed for carrying out each stage of the fabrication process, separate sub-chambers may be provided. For example, the first material source and the second material source may be each connected individual sub-chambers.

To facilitate transfers of a base substrate under vacuum or inert atmosphere from one chamber to another, a load lock system may be used. A conventional loadlock may be mounted to a gate valve attached to a main vacuum chamber. A substrate can then be easily moved into position through the large entry door onto the transfer stage in the loadlock chamber. After the loadlock is evacuated to the desired vacuum level, and the gate valve opened, the substrate is transferred into the process chamber through a magnet carriage along the main shaft of the loadlock. This allows repeated substrate loading and unloading without breaking vacuum in the main chamber. If vacuum chamber comprises a plurality of serially connected sub-chambers, the loadlock may comprise an extendable shaft movable through each individual sub-chamber.

High vacuum pumping outfits may be connected to the vacuum chamber, including mechanical booster, rotary, turbo, cryo-pumping stations which can deliver ultra high vacuum for the vacuum sealing applications. Additionally, pressure gauges, gas lines, pressure transducers and isolation valves may be included to monitor the vacuum in the vacuum chamber.

The holding jig for receiving a substrate holding table on which to form the encapsulated device is further provided. A substrate holding table (platform) may be attached to the holding jig, and may preferably includes a heating unit to provide heat of up to 100° C. or more, and a temperature controller for maintaining the required temperature. The heating process may be used to melt the adhesive while vacuum bonding the cover substrate and the device.

A linear motion drive is used to apply a normal force onto a sample on the holding jig, and may be used to compress a cover substrate onto an adhesive. The linear motion drive may be operated by a pneumatic actuator or with external motor with an axial load of about 5 lb to 100 lb or more to provide a pressure range of 40 to 80 psi for encapsulation.

In one embodiment, the system further comprises means for aligning the linear motion drive and holding jig. The linear motion drive and holding jig alignment may be directed along a supporting frame and linear ball guides. The supporting jig is designed such that the adhesive can be loaded onto the jig through load lock of the vacuum chamber. Similarly, the device or substrates can be transferred to the substrate holder through the load lock for the secondary sealing process.

Any conventional RF plasma cleaning source may be provided for carrying out surface pre-treatment. One example is the Evactron® plasma source from XEI Scientific, Inc. which uses air as the oxygen source. The Evactron® plasma source produces oxygen radicals for removing oils and chemicals on any surface. The plasma source may be adapted for external mounting on the vacuum chamber.

Other features which may be incorporated into the system include a substrate holding table with x, y & z axis controller for positioning the holding table, as well as a radio frequency power controller for controlling the RF power of the plasma source. A UV source may be included in the system to cure any UV-curable adhesive that is used in the encapsulation. Wavelengths of about 365 nm and about 300 nm with the respective intensities of about 85 mW/cm$^2$ and about 22 mW/cm$^2$ may be used to cure the adhesive.

These aspects of the invention will be more fully understood in view of the following description, drawings and non-limiting examples.

BRIEF DESCRIPTION OF THE DRAWINGS

Illustrative embodiments will now be described by way of non-limiting examples only, with reference to the accompanying drawings, in which:

FIG. 10A is a photograph (50× magnification) that depicts zinc oxide nanodots that can be used as starting material for generating, through ripening, zinc oxide nanorods that can be used in an ultraviolet light neutralizing layer of a multilayer barrier film of the invention. FIG. 10B shows zinc nanorods (10× magnification), and FIG. 10C shows zinc rods dense nanostructure (10× magnification).

FIG. 11 depicts the transmittance of a barrier film of the invention that includes a UV neutralizing layer with only the seed layer of zinc oxide nanoparticles before the growth of the zinc oxide nanorods (black curve) and after the growth of the zinc oxide nanorods (grey curve) and an nanostructured layer that includes aluminum oxide nanoparticles as reactive nanoparticles capable of interacting with moisture and/or oxygen.

FIG. 12A shows an EL device encapsulated with a solvent protection layer on a glass or rigid substrate. FIG. 12B shows zinc oxide nanorods/nanoparticles grown as the active component in the UV light neutralizing layer on a plastic or rigid cover substrate. FIG. 12C shows zinc oxide nanoparticle dispersed acrylic polymer deposited on zinc oxide nanorods. FIG. 12D shows the cover substrate coated with UV filter and uncured reactive nanoparticle dispersed acrylic polymer. FIG. 12E shows the encapsulated OLED before and FIG. 12F shows the encapsulated OLED after curing of the barrier films.

DETAILED DESCRIPTION

Figure 1:
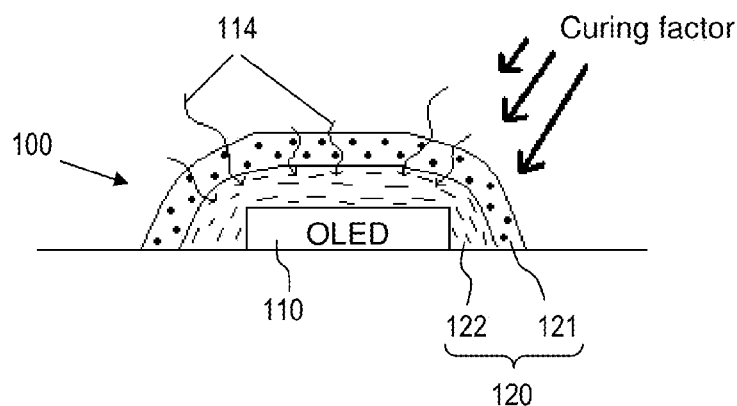
FIG. 1 depicts an encapsulated OLED according to one embodiment of the invention.

FIG. 1 shows a simplified schematic diagram of an encapsulated device 100 according to one embodiment of the invention. The encapsulated device 100 comprises an OLED 110 covered by a multilayer barrier film 120 comprising a nanostructured layer 121 which contains nanoparticles capable of absorbing moisture and/or oxygen, and a neutralizing layer 122. The nanostructured layer may be formed from a nanoparticle dispersion that is cast onto the neutralizing layer. Exposure to a curing factor subsequently brings about the polymerization of the monomer. In order to prevent the curing factor from reaching the OLED, the neutralizing layer is deposited closer to the OLED than the nanostructured layer, so that the nanostructured layer is cured without damaging the OLED. Arrows 114 depict the curing factor penetrating the nanostructured layer containing the nanoparticles, thereby polymerizing the monomers to form the nanostructured layer. However, the curing factor is absorbed by the neutralizing layer and is prevented from reaching the OLED.

Figure 2A:
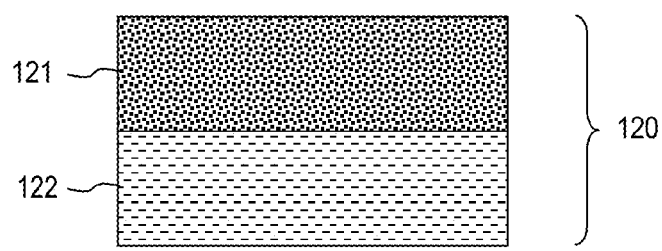
FIG. 2A depicts one embodiment of the layer structure of the multilayer barrier film.
Figure 2B:
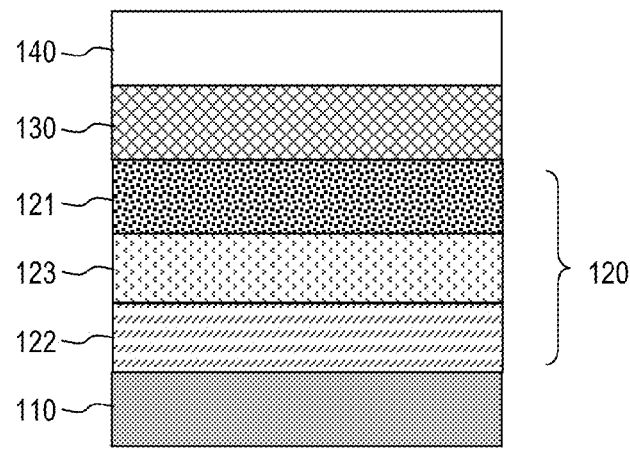
FIG. 2B depicts another embodiment of the layer structure of the multilayer barrier film with adhesive layer and glass covered incorporated.

FIG. 2A shows a magnified view of one embodiment of the multilayer barrier film according to the invention. Multilayer barrier film 120 comprises a distinct nanostructured layer 121 which contains nanoparticles dispersed therein. Adjacent to the nanostructured layer 121 is a neutralizing layer 122 that absorbs the curing factor. Although presently depicted as adjacent layers, the nanostructured layer 121 and the neutralizing layer 122 maybe spaced apart from each other by intervening layers without comprising the function of either layer. FIG. 2B shows an alternative layer arrangement in which the multilayer barrier film 120 comprises a nanostructured layer 121 that is spaced apart from the neutralizing layer 122 by an optical layer 123. The multilayer barrier film is arranged onto an OLED 110, with the neutralizing layer arranged nearest to the OLED 110. An adhesive layer 130 is disposed onto the multilayer barrier film 120 in order to tack a glass substrate 140 that serves to protect the OLED 110.

Figure 3A:
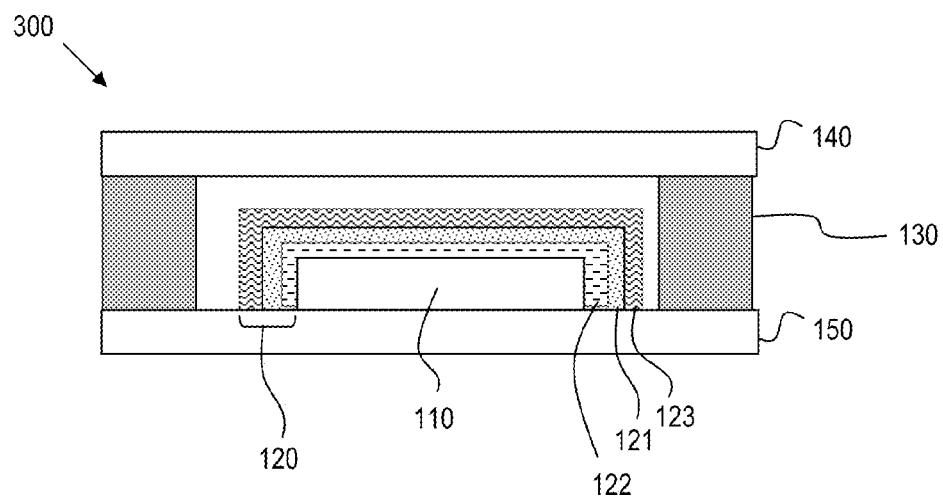
FIG. 3A depicts an OLED encapsulated within a rim-sealed panel, underneath a multilayer barrier film according to one embodiment of the invention.

FIG. 3A shows an encapsulated device 300 depicting a rigid standard glass-to-glass OLED panel in which OLED 110 is covered by a multilayer barrier film 120 and encased within a rim-sealed structure comprising base substrate 150, rim-sealing adhesive 130, and cover substrate 140. The multilayer barrier film 120 comprises nanostructured layer 121 sandwiched between neutralizing layer 122 and optical layer 123. The OLED 110 emits light through the multilayer barrier film 120 towards the transparent cover substrate 140. By covering the OLED 110 with the multilayer barrier film 120, any moisture and/or oxygen that permeates through any of the structural components of the encapsulated device 300 are prevented from reaching OLED by reactive nanoparticles present in the nanostructured layer 121. This embodiment is suitable for large OLED panels as the location of the adhesive 130 only at the edges of the device 300 minimizes the use of adhesive.

Figure 3B:
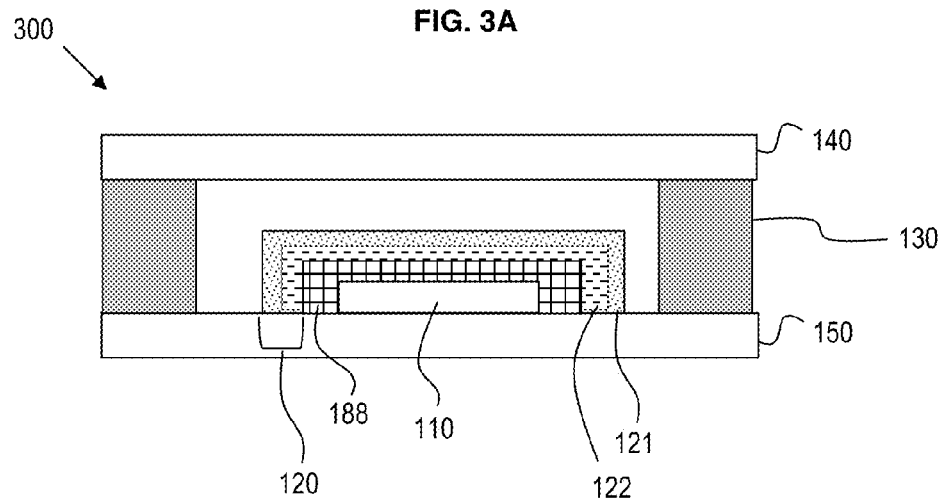
FIG. 3B depicts an OLED located in a chamber which is defined by a multilayer barrier film according to one embodiment of the invention.

FIG. 3B shows an embodiment which is similar to the encapsulated device 300 shown in FIG. 3A. In contrast to the embodiment shown in FIG. 3A, the OLED is located in a chamber 188, i.e. the OLED is not in direct contact with the multilayer barrier film. Also the multilayer barrier film does not comprise an optical layer between the UV neutralizing layer 122 and the nanostructured layer 121. However, it should be noted that an optical layer can still be included in the embodiment shown in FIG. 3B.

Figure 4:
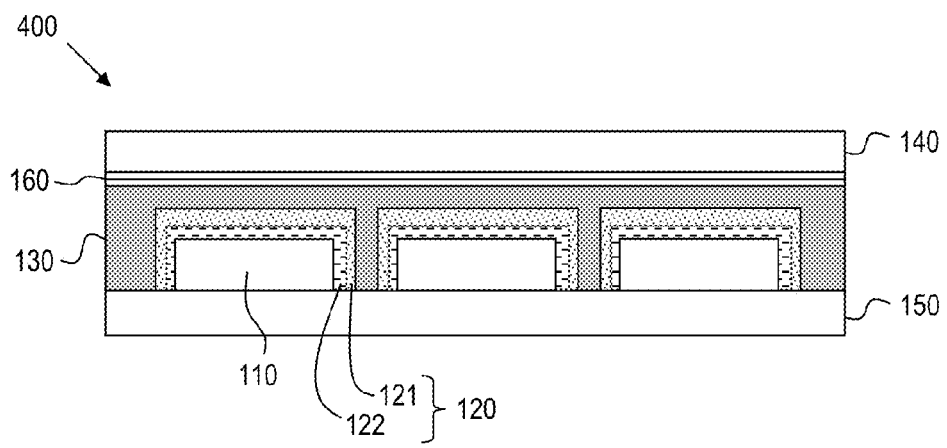
FIG. 4 depicts an OLED encapsulated within a proximally sealed panel, the OLED being covered beneath a multilayer barrier film according to one embodiment of the invention.

FIG. 4 depicts an encapsulated device 400 depicting a flexible, thin film OLED display in which OLEDs 110 are covered by a multilayer barrier film 120 and encased within a proximally sealed structure comprising base substrate 150, adhesive 130 disposed proximally onto the OLEDs 110, and cover substrate 140 tacked to the adhesive 130. The multilayer barrier film comprises nanostructured layer 121 and an underlying neutralizing layer 122. Optical layer 160 is added to enhance the transmission of light from the OLEDs 110. In this embodiment, the multilayer barrier film 120 is fully in contact with the adhesive 130, thereby enabling the cover substrate to be more strongly tacked so as to minimize delamination.

Figure 5:
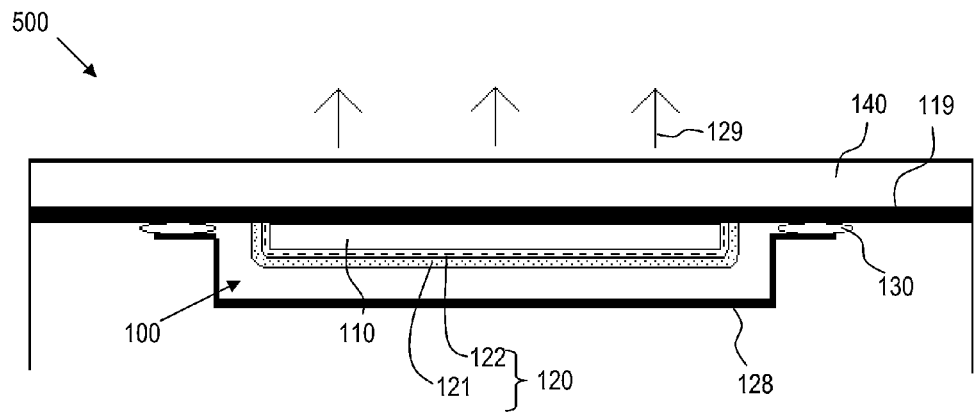
FIG. 5 depicts a simplified schematic diagram of an OLED panel containing an OLED encapsulated by a multilayer barrier film according to one embodiment of the invention.

FIG. 5 is a schematic diagram depicting an implementation of the multilayer barrier film according to the invention in the context of an actual OLED panel, such as that shown in European Patent Application 0 776 147 A1. The OLED panel 500 with the encapsulated OLED 100 comprises OLED 110 formed on an ITO substrate 119, which is in turn adhered to a glass cover panel 140. The OLED 110 is protected from moisture through the application of multilayer barrier film 120 comprising an inner neutralizing layer, and an outer nanostructured layer comprising nanoparticles that are reactive towards moisture and/or oxygen. The OLED 110 is sealed off from the external environment by attaching a cover over the OLED 110, with adhesive applied to the edges of the cover to establish a rim-sealed structure. On the opposing side the encapsulated OLED is furthermore encased in a glass sealing case 128 attached to the ITO substrate via a rim-sealing adhesive 130. Light (illustrated by arrows 129) from the OLED 110 is emitted in the direction of the arrows 129.

Figure 6:
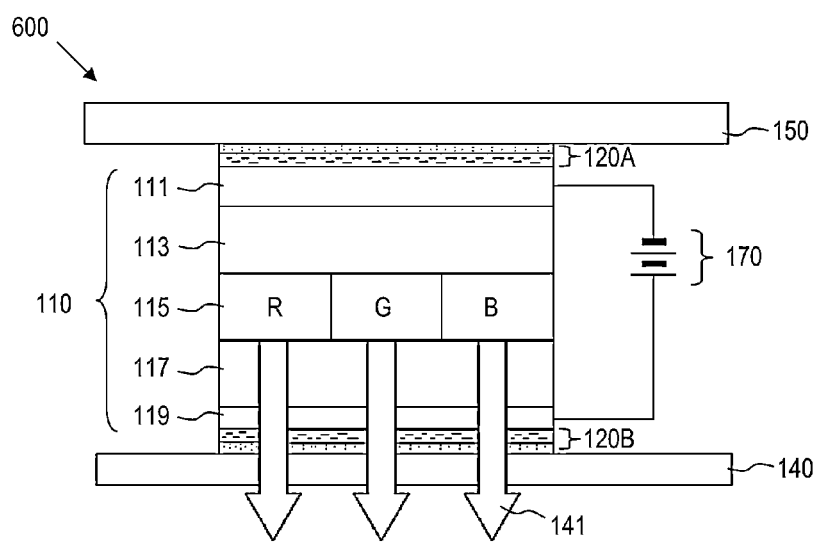
FIG. 6 depicts a simplified schematic diagram of a RGB color display OLED panel containing OLED layers sandwiched between multilayer barrier films according to one embodiment of the invention.

FIG. 6 is a schematic diagram depicting another implementation of the present invention in the context of a Red Green Blue (RGB) color OLED pixel. The encapsulated OLED pixel structure 600 comprises organic layers sandwiched between a transparent anode 119 and a metallic cathode 111. The organic layers comprise a hole-transport layer and hole-injection layer 117, an emissive layer 115 capable of emitting primary colors, and an electron-transport layer 113. When an appropriate voltage 170 is applied to the organic layers, the voltage give rise to charges which then combine in the emissive layer 115 to cause light 141 to be emitted. The multilayer barrier film 120A, 120B is situated on the metallic cathode 111 as well as on the transparent anode 119, respectively. On top of the multilayer barrier film 120A a base substrate 150 is provided while the multilayer barrier film 120B is terminated by a cover substrate 140, such as a transparent glass cover substrate.

Figure 7:
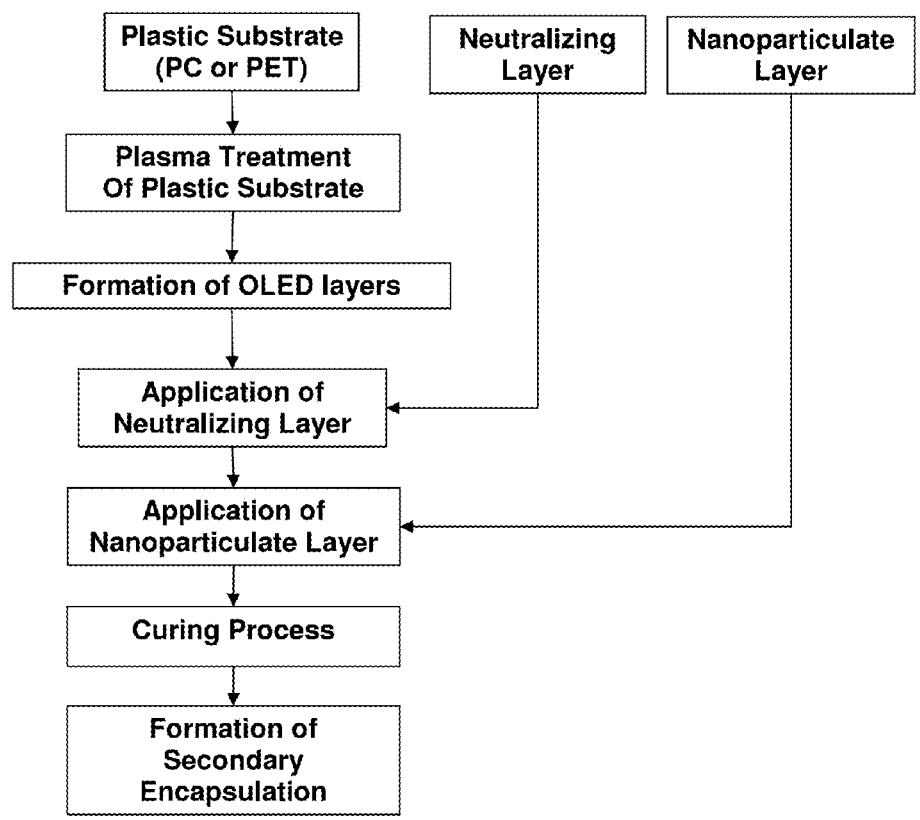
FIG. 7 depicts a process scheme for encapsulating an OLED with a multilayer barrier film.
Figure 8:
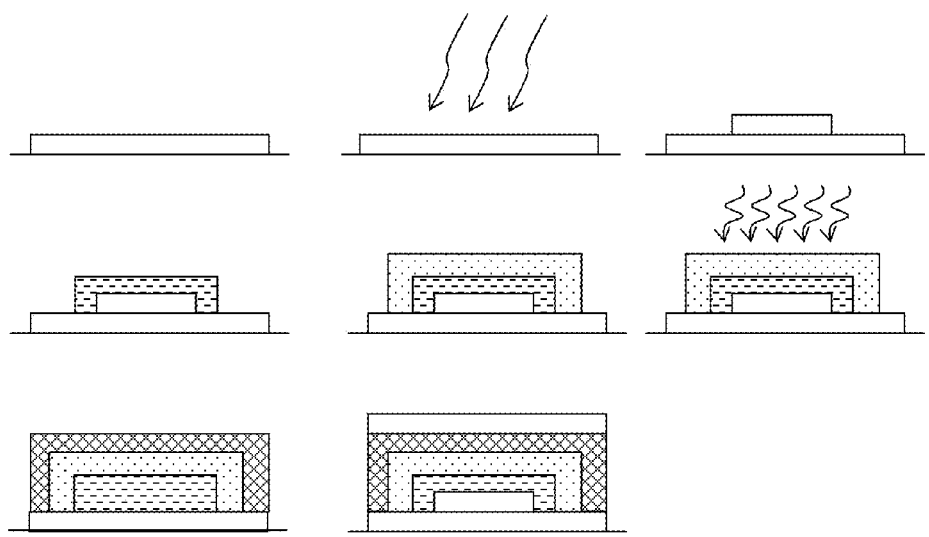
FIG. 8 depicts the encapsulation of an OLED in accordance with the process scheme, based on a cross-sectional view of the layer-structure.

The general scheme of fabrication of the encapsulation barrier film according to the invention is shown in FIG. 7. A conventional polycarbonate or PET substrate is provided for forming the OLED. The substrate is first plasma treated to remove contaminants present on the surface of the substrate. After plasma treatment, the electronic device is formed on the substrate. In the case of OLED devices, the fabrication of the organic EL layers of the OLED can be carried out under vacuum conditions.

Subsequently, the multilayer barrier film is formed over the OLED device. Formation of the multilayer barrier film comprises forming a neutralizing layer (such as by spin coating or by atomic deposition, and then forming over the neutralizing layer (either directly or indirectly) a nanostructured layer comprising moisture and oxygen reactive nanoparticles distributed within a polymer. Curing is subsequently carried out, after which a multilayer barrier film comprising the neutralizing layer and the nanostructured layer is formed. Secondary encapsulation structures, such as an adhesive layer along with a cover substrate, are then formed to further encapsulate the device.

Figure 14:
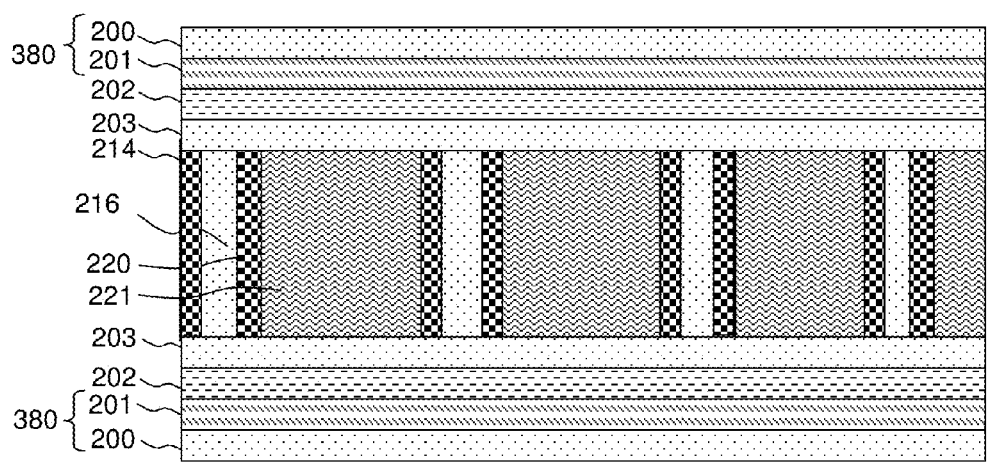
FIG. 14 shows an embodiment of a photovoltaic device comprising a multilayer barrier film of the invention.
Figure 15:
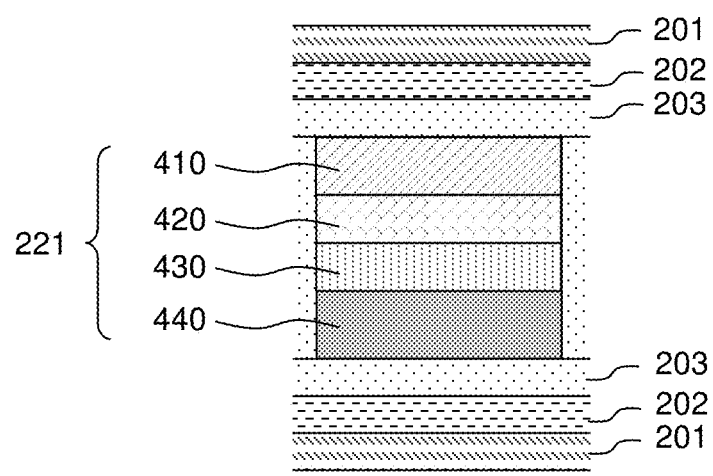
FIG. 15 shows a further embodiment of a photovoltaic device comprising a multilayer barrier film of the invention.

In another embodiment the multilayer barrier film is used to encapsulate a photovoltaic device, such as DSSC solar cell. Exemplary embodiments demonstrating the usage of the multilayer barrier film of the present invention for encapsulation of photovoltaic devices are illustrated in FIGS. 14 and 15. As can be seen in FIG. 14 the multilayer film is laminated over the photovoltaic device 221, such as a DSSC solar cell on the bottom as well as on the top of the solar cell. In contrast to the previous embodiments described, the first layer laminated on the solar cell element 221 shown in FIGS. 14 and 15 is the nanostructured layer 203 and not the UV neutralizing layer. In the embodiment shown in FIGS. 14 and 15 the nanostructured layer 203 is followed by the UV light neutralizing layer 202. Thus, it is noted here that both arrangements of these two layers are suitable in an encapsulation barrier film of the invention, meaning the UV neutralizing layer can be the "first layer" or the layer that contact the device to be encapsulated followed by the nanostructured layer arranged as "second layer" thereon, or alternatively, the nanostructured layer can be the contacting first layer with the UV neutralizing layer arranged thereon as the second layer.

The multilayer film 203, 202 in the embodiment illustrated in FIG. 14 can be laminated by a barrier substrate 201 and another multilayer film or only an UV light neutralizing layer 200 as shown in FIG. 14. As shown in FIG. 15 it is however also possible to laminate the multilayer film 203, 202 only with a barrier substrate 201 without adding a further UV light neutralizing layer. However, such additional layers on top of the multilayer film 203 and 202 are optional such as the combination of layers 380 shown in FIG. 14. In another embodiment, such additional layers may be located only on one side of the encapsulated photovoltaic device.

FIG. 14 also illustrates another potential function of the nanostructured layer 203, which is used in the embodiment illustrated in FIG. 14 as backing structure comprised of layers 214, 216 and 220 or only of layer 216. In the embodiment illustrated in FIG. 14, the backing structure is attached/connected to the nanostructured layer 203 via an adhesive 214 and 220. In another embodiment, the backing structured comprised only of the nanostructured layer is attached/connected to the nanostructured layer 203 via the nanostructured layer 216.

The adhesive can, for example, be ethylene vinyl acetate resins, epoxy resins, polysulfide, silicone and polyurethane. Due to the adsorption capacity of the nanoscale particles in the nanostructured layer of the backing structure, the nanostructured layer 216 does not only protect the solar ceil against oxygen and moisture but also provides a cushion in case of electrolyte leaking from the solar cell. Even in case one solar cell is leaking the backing structure will soak up the electrolyte and protect the neighboring solar cell. On the other hand the backing structure forms a connection to the nanostructured layer 203. To connect the backing structure with the nanostructured layer 203 and adhesive 214, 220 can be used. In another embodiment, it is also possible to use 5 an adhesive layer which is located as thin film between the nanostructured layer 203 and the nanostructured layer 216. Thus, the adhesive layer would be located at both ends of the nanostructured layer 216 connecting it with the nanostructured layer 203.

FIG. 15 illustrates a further embodiment in which the photovoltaic device is a dye-sensitized solar cell (DSSC). The basic setup of such a structure is the same as in FIG. 14. The only difference is that the backing structure shown in FIG. 15 comprises only of a nanostructured layer. The DSSC 221 in FIG. 15 comprises a titanium foil 440, the titanium oxide layer including the dye, the electrolyte 420 and the indium tin oxide (ITO) layer. The working principle and manufacture of a DSSC has already been explained further above and is also referred to in the article of So'mmeling, P. M., Spath, M. et al. (EPSEC-16 (European Photovoltaic Solar Energy Conference), Glasgow, 1-5 May 2000, Title: "Flexible Dye-Sensitized Nanocrystalline $TiO_2$ Solar Cells") and the master thesis of Janne Halme (Master thesis of Feb. 12, 2002, Title: Dye-sensitized nanostructured and organic photovoltaic cells: technical review and preliminary tests); Helsinki University of Technology, Department of Engineering Physics and Mathematics).

The backing structure on the right and left side of the DSSC solar cell prevents or blocks the electrolyte 420 in case of leaking and thus protects the other solar cell. Use of a backing structure can provide improved barrier properties of rim sealing as compare to an adhesive wire. Also, in addition to an adhesive wire sometimes an additional layer is applied which is made of, e.g., ethylene-vinyl acetate (EVA) copolymers and adhesive heat seal laminations.

In one embodiment, the backing structure may be comprised of a nanostructured layer and or chemical resistant monomer or polymer or ethylene vinyl acetate copolymers that can block electrolyte leakage. A nanostructured layer can block moisture and oxygen permeation into the device package. A nanostructure layer can also act as a chemical resistant material and may be used to block electrolyte leakage. In one embodiment, a backing structure can be manufactured of a nanostructured layer sandwiched between two adhesive layers (see FIG. 14) while in another embodiment the backing structure is manufactured only of a nanostructured layer (see FIG. 15).

Specific examples will now be described to illustrate the fabrication process as described above as well as the barrier performance of fabricated encapsulation barrier films.

Example 1: Fabrication of an Encapsulated OLED

1. Surface Preparation of Substrates

Silicon oxide coated soda-lime glass substrates (display-quality glass) were cut into 50 mm×50 mm pieces and also any required sizes for use as a base or cover for the OLEDs. The pneumatically operated hollow die punch-cutting equipment or any conventional slitting machine could be used to slice the samples into the specified or required dimensions.

The water vapor permeation in the present encapsulation package may be mainly through the interface of the adhesive and substrate and also diffusion through adhesive sealing. The suitable surface pre-treatment process such as plasma treatment can eliminate the adhesion issues. Accordingly, they are rinsed with isopropyl alcohol (IPA) and blow-dried with nitrogen. These processes help to remove macro scale adsorbed particles on the surface. Acetone and methanol cleaning or rinsing is not recommended. After nitrogen blow-dry, the substrates are placed in the vacuum oven, with the pressure of $10^{-1}$ mbar, for degassing absorbed moisture or oxygen. The vacuum oven is equipped with fore line traps to prevent hydrocarbon oil back migrating from vacuum pump to the vacuum oven. Immediately after the degassing process, the barrier films are transferred to the plasma treatment chamber (e.g. ULVAC SOLCIET Cluster Tool). RF argon plasma is used to bombard the surface of the barrier film with low energy ions in order to remove surface contaminants. The base pressure in the chamber was maintained below $4\times10^{-6}$ mbar. The argon flow rate is 70 sccm. The RF power is set at 200 W and an optimal treatment time usually 5 to 8 eight minutes is used depending on the surface condition.

2. OLED Fabrication

The OLED architecture described in International Patent Application WO 03/047317 A1 has been adopted in the present example. ITO-coated glass with a sheet resistance of 20 Ω/square was used as a substrate for the OLED device fabrication. Wet chemical cleaning was undertaken with acetone and methanol and followed by dry oxygen plasma treatment. Poly (styrene sulfonate)-doped poly (3,4-ethylene dioxythiophene) (PEDOT) was used as a hole transport layer (HTL). The commercially available phenyl-substituted poly (p-phenylenevinylene) (PPV) yellow light emitting polymer was used. Small molecule based OLED structure was adopted in which 65 nm thick electroluminescence layer tris-(δ-hydroxyquinoline) aluminum (AlQ3) is deposited at 270° C. under high vacuum of $2\times10^{-5}$ Pascal. A 5 Å (0.5 nm) thick LiF is deposited at 650° C. as an interlayer between organic electroluminescence (EL) panel and cathode. The aluminum cathode was deposited using thermal evaporation at a thickness of 200 nm.

3. Hafnium Oxide Neutralizing Layer Deposition

The substrate along with the OLED are transferred under vacuum to an evaporation chamber, where a layer of hafnium oxide thin film is synthesized from tetrakis(dimethylamino) hafnium and (TDMAH) and ozone ($O_3$) by atomic layer deposition (ALD) in accordance with the procedure described in D3.8.1, Mat. Res. Soc. Symp. Proc. Vol. 765, 2003 Materials Research Society. Other methods known in the art include electron-beam evaporation or sputtering.

4. Multilayer Barrier Film Proximal Encapsulation

A nanostructured layer derived from a mixture of polymerizable acrylic acid containing a dispersion of aluminum oxide nanoparticles is spin coated onto the hafnium oxide covered OLED, and the acrylic acid monomer is cured through exposure to UV.

$HfO_2$ UV filter layer and optical layers can also be deposited by PVD methods including sputtering, thermal evaporation or electron beam evaporation, plasma polymerization, CVD, printing, spinning or any conventional coating processes including tip or dip coating.

5. Fabrication Equipment

Figure 9A:
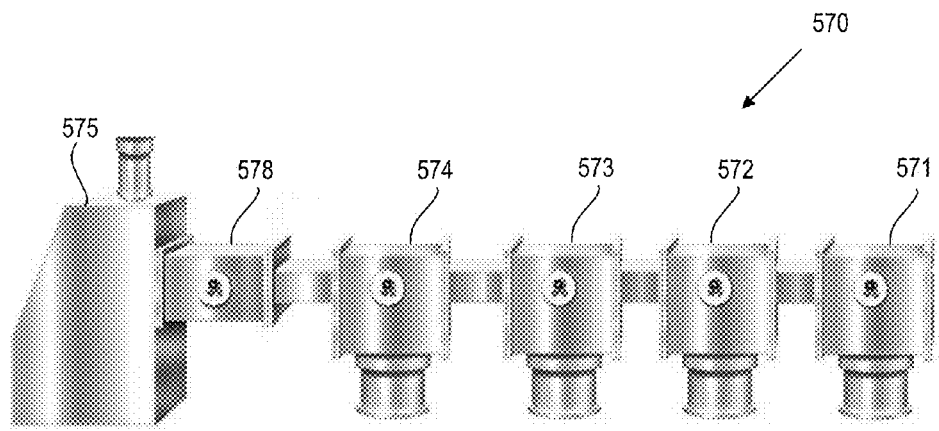
FIG. 9A depicts a simplified set of process equipment required for encapsulating an electronic device and FIG. 9B depicts an apparatus for batch fabrication and encapsulation of an electronic device.

The fabrication process described above may be carried out either in an in-line system or a roll-to-roll system. An in-line fabrication system 570 is depicted in FIG. 9A. The system comprises serially connected sub-chambers used for carrying out the steps of cleaning the base substrate, forming the electronic component, forming the gas permeation sensor, and then carrying out the encapsulation of the device, each step being carried out within separate sub-chambers. For instance, in the case of an OLED, the formation of OLED anode, organic EL layer, and cathode may be carried out in sub-chambers 571, 572 and 573, respectively, and gas permeation sensor is carried out in sub-chamber 574. Plasma cleaning and encapsulation may be carried out in a sub-chamber 575. The base substrate, carrying both sensor and electronic component, may finally be transported by a load-lock 578 into the sub-chamber 575, which may be a glove box, for example.

Figure 9B:
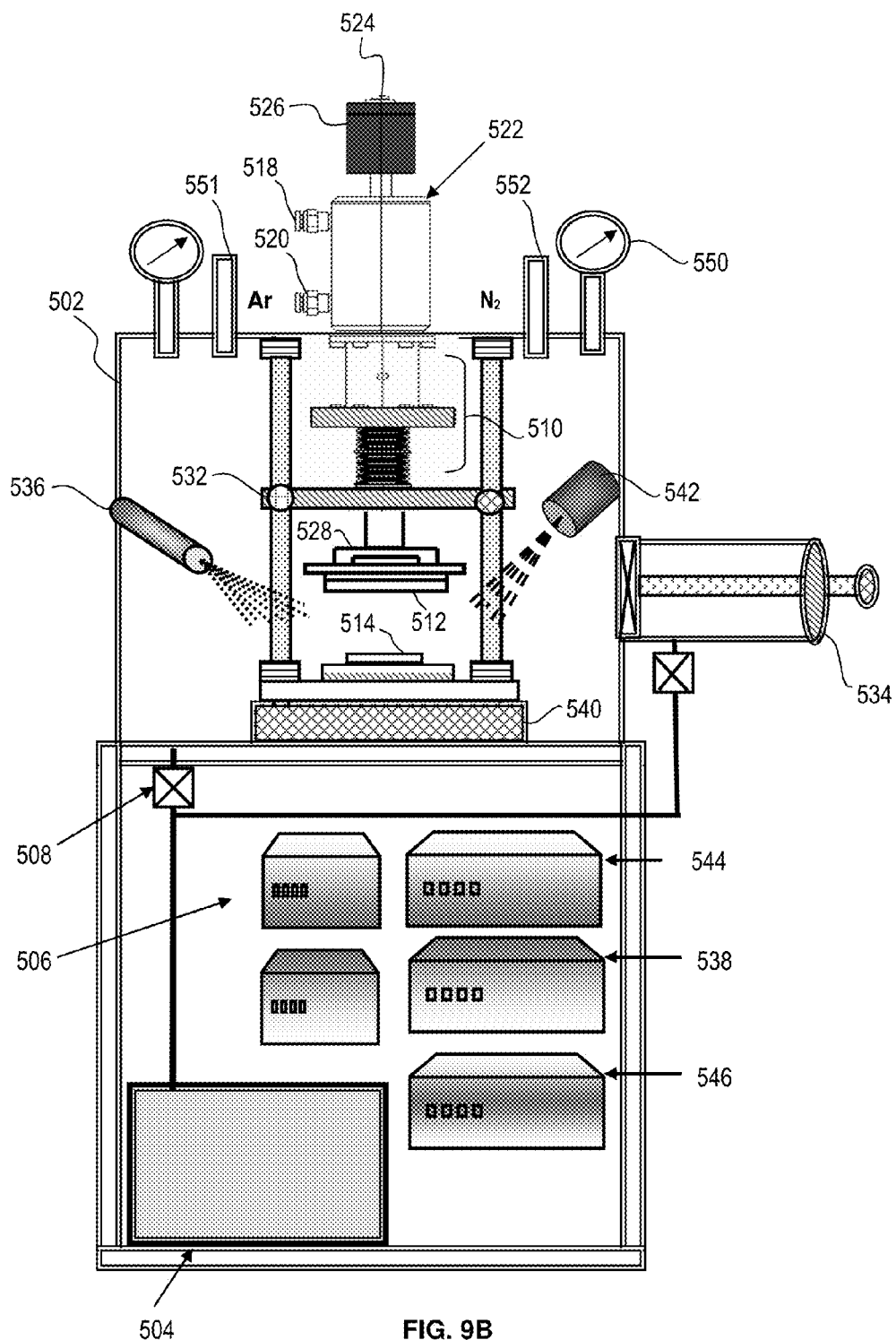

In one exemplary embodiment, sub-chamber 575 may be a lab-scale glove box 500 for carrying out gas permeation sensor batch fabrication and encapsulation as shown in FIG. 9B. In this example, the vacuum chamber 502 has dimensions of 400 5 mm×500 mm×650 mm, is connected to the high vacuum pumping station 504 (preferably mechanical booster with combination of rotary vacuum pump) and is maintained at a base pressure $10^{-4}$ mbar. The high vacuum Pirani gauge 506 is used to monitor the vacuum pressure. The isolation valve 508 is used for isolating the vacuum pumping station 504 and the vacuum chamber 502. The linear motion drive 510 is used for sealing the adhesive pad 512 onto the OLED device 514 under vacuum. The linear motion drive 510 is mounted through a KF25 flange connection 516 to the vacuum chamber and it is pneumatically operated to drive the linear motion system.

Pneumatic linear motion feedthrough provides action for linear motion by applying a suitable compressed air pressure in the range of 40 to 80 psi (275.79 kPa to 551.58 kPa). The compressed air is admitted through the inlet 518 and outlet 520 of the pneumatic actuator. Linear travel can be shortened or lengthened by turning the adjustment knob located at the top end of the pneumatic actuator 522. Once adjusted, the jam nut 524 locks the adjustment knob 526 in place. Linear travel adjustment can be made up to the required travel distance. A suitable adhesive holding jig 528 is connected to the linear motion drive 510 for holding the adhesive pad 512 used for sealing the device. The linear drive's axial load is typically 20 lb (about 9.07 kg). The holding jig 528 is also used to apply pressure while the adhesive sealing process is undertaken. The pressure typically applied is in the range of 40 to 80 psi (275.79 kPa to 551.58 kPa) and the required pressure is tailored to the type of substrate/device used. The pressure can be applied either on the rim or the entire face of the substrate. The different types of holding jigs can be used as per the requirement of packaging. They are constructed of high grade vacuum compatible materials. The use of welded stainless steel bellows and linear bearing shaft support provide reliability and smooth operation. Pneumatic feedthroughs can be chosen from industry standard components, such as, either conflat compatible Del-Seal CF metal seal flanges or ISO KF Kwik-Flange elastomer seal port mounts.

The smooth operation of the linear motion drive, holding jig movements, and alignments with the substrates are carefully controlled by the supporting frame 530 and linear ball guides 532. The holding jig is designed such that the adhesive can be loaded onto the jig through a load-lock 534 of the vacuum chamber. Similarly, the device or substrate can be transferred to the substrate holder through of load-lock for the secondary sealing process.

The vacuum chamber 502 is further equipped with a plasma source 536 for surface pre-treatment or cleaning before the adhesive bonding process. The radiofrequency (RF) power controller 538 is used for controlling the RF power of the plasma source. Surface preparation consists of cleaning or surface modification done to the as-received sample or devices in order to obtain desired and reproducible properties. In the case of a polymer substrate, there are many avenues for surface contamination on the barrier film surface and also the polymer base substrate tends to absorb water vapor due to long storage time and from handling and exposure to ambient conditions. Any surface contamination would certainly affect adhesion of the adhesive pad. Radiofrequency (RF) argon plasma is used to bombard the surface of the substrate or primary sealed device with low energy ions in order to remove surface contamination. The base pressure in the chamber is maintained below $4 \times 10^{-6}$ mbar and is monitored by a pressure monitor 550. The argon flow rate is 70 sccm. The radiofrequency (RF) power is set at 200 W and an optimal treatment time is normally 5 to 8 eight minutes depending on the surface condition. The argon gas line 551 is connected to the vacuum chamber to introduce argon used for plasma treatment. The nitrogen gas line 552 is connected to the vacuum chamber for venting the chamber after the plasma treatment process.

The substrate heating table 540 can provide up to 100° C. and the temperature controller is used to maintain required temperature. The heating process to melt the adhesive during vacuum bonding the device. After the vacuum sealing process, the adhesive can be cured by exposure to UV light for 30 seconds. A 400 W metal halide light UV source 542 (model 2000-EC) is used to cure the adhesive. Wavelengths of 365 nm & 300 nm with the respective intensities of 85 mW/cm$^2$ and 22 mW/cm$^2$ may be used to cure the adhesive.

The sequence of fabrication can be chosen flexibly according to the encapsulation design, the type of OLED architecture, substrates and can be used not only for batch and in-line fabrication systems shown herein, but can also be adapted to roll-to-roll processes as well.

Example 2: Encapsulation Vacuum Transfer Technique

The fabrication of the barrier film and the subsequent device encapsulation will be illustrated in the following for highly moisture or oxygen sensitive (up to a water permeation rate of $10^{-6}$ g/m$^2$/day level), organic devices fabricated on to rigid or plastic substrates, using either an on batch or roll to roll process:

1. Device 110—Organic Light Emitting Diode
2. Solvent protection layer—High refractive index solvent protection optical film (optional)
3. Neutralizing layer—Titanium oxide/Zinc Oxide rod structured acrylic polymer
4. Nanostructured layer—Reactive nanoparticles (other than titanium oxide or zinc oxide, respectively) dispersed in acrylic polymer
5. Cover substrate—Barrier Plastic substrate/glass substrate The device with the multi-layer barrier film of the invention that includes layers 3 and 4 will be adopted if cover substrates are fabricated on to plain plastic substrates. The solvent protection layer (film) 2 is only used optionally for protecting the device as a first layer; it is not involved in the multi-layer barrier structure.

Figure 12A:
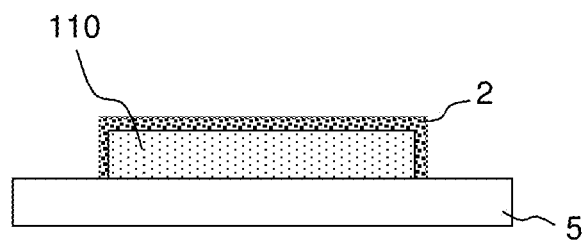
FIGS. 12A-12F show manufacturing of an OLED encapsulated with a multilayer barrier film according to one embodiment of the invention.

Deposition of solvent protection layer on to EL device (organic electroluminescent (EL) panel) FIG. 12A shows an EL device encapsulated with solvent protection layer 2 on to glass or rigid substrate 5 before encapsulation of the device 110 with a multilayer barrier film of the invention (that includes the UV neutralizing layer and the nanostructured layer containing reactive nanoparticles capable of interacting with moisture and/or oxygen).

After OLED fabrication, the solvent protection layer 2, magnesium oxide is in a first step deposited by thermal evaporation method on to the organic EL device (organic electroluminescent (EL) panel). This layer helps to prevent the residual solvent permeation or reaction with organic electronic devices such as organic light emitting diodes. Some of the electronic devices such as inorganic electroluminescence devices or inorganic photovoltaic (PV) devices may not require this solvent protection layer. This magnesium oxide or magnesium fluoride layer 2 does not contribute at all or—not significantly to the improvement of the overall barrier properties. The solvent protection layer 2 can, for example, be HfOx, MgO, MgF, BaO, BaF, and LiF or any suitable optical inorganic films with either high refractive or low refractive index optical properties. A high refractive index optical film can be preferred in the event that top emitting OLEDs and photovoltaics devices are encapsulated.

The fabrication of the layers of the barrier film of the invention can be carried out as follows, using, for illustration purposes, the fabrication of multi-layer encapsulation layers on to plastic substrate 5.

Figure 12B:
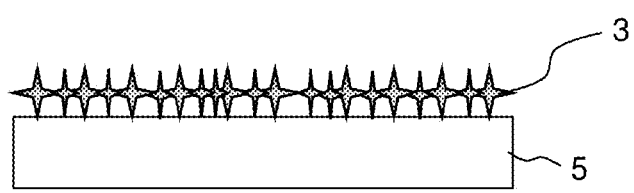

As shown in FIG. 12B zinc oxide nanorods/nanoparticles 3 are grown as the 5 active component in the UV light neutralizing layer 122 on to a plastic or rigid cover substrate 5 as follows.

B1—Zinc Oxide Nanorods 3 (or Titanium Oxide Particles) Deposited on to the Cover Rigid or Plastic Substrate 5.

In a first step of generating the UV light neutralizing layer, commercially available nanoparticle dispersions of zinc oxide, or titanium oxide dispersed in hexane diol diacrylate or isobornyl acrylate or tripropylene glycol diacrylate can be used to deposit nanodots (20 to 50 nm) first on to rigid substrate or a flexible plastic substrate by any conventional coatings method such as spin coating, screen printing, ink jet printing or any imprinting methods or roll to roll coating methods such as tip coating, WebFlight, Slot die coatings etc. After the deposition, the solvent can be removed at thermal annealing at 80° C. for few minutes can take place. A solvent thermal route is used to grow zinc oxide nanorods by exposing the substrate 5 to zinc acetate and ammonium hydroxide solution. Zinc oxide nanodots (FIG. 10A) will ripen to nanorod morphologies (FIG. 10B and FIG. 10C) at temperatures of 60° C. to 120° C. within a time of 10 min to 60 min. Use of nanodots as nuclei is one of the approaches that will allow for controlled growth of higher aspect ratio nanorods. Several solvent thermal routes and hydrolysis processes exist that can be employed to grow the zinc nanorods 3 on to the plastic substrates 5. The atomic force microscope (AFM) photographs of nanodots and nanostructures are shown in FIG. 10A to FIG. 10C. These nanorods can be deposited either on barrier coated plastic or any rigid substrate like glass. These nanorods can be used alone in the UV neutralising layer 122 due to their property to scatter the light. It is however also possible to add zinc oxide particles to this film in order to improve the UV filter properties. The structure of a UV neutralizing layer containing Zinc oxide nanoparticles (depicted as small black squares 4 in the layer 122) dispersed in acrylic polymer and deposited onto Zinc oxide nanorods (depicted as "star-like" grey structures 3) is shown in the following.

Figure 12C:
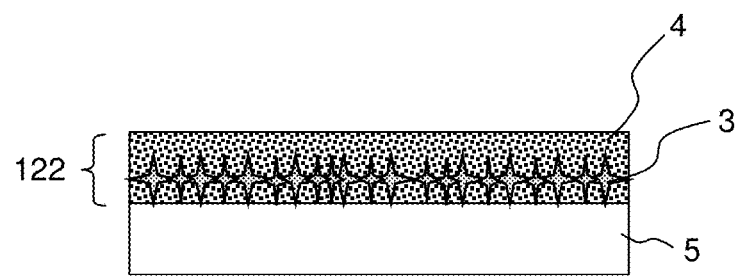

B2—Zinc Oxide Nanoparticle Dispersed Acrylic Polymer Deposited on to Zinc Oxide Nanorods (FIG. 12C).

For incorporating the zinc oxide nanoparticles into the UV light neutralizing layer, 40 ml of UV curable acrylate monomer with a coating weight of about 100% of the sealing solution was added to 5 ml of a dispersion of zinc oxide in tripropylene glycol diacrylate (35% weight), obtainable from Nanodur of Nanophase Technologies. 15 ml of an organic solvent of PGME and EG (1:1) ratio was added to the mixture. Sonification of the mixture was then carried out for about 1 hour prior to deposition onto a barrier oxide layer. The formation of the film that includes both the nanorods and the nanoparticles via spin coating was undertaken in a nitrogen atmosphere in a glove box. The oxygen and water vapor contents were reduced to less than 1 ppm level in the glove box. This layer was then cured via UV before applying the film that contains the reactive nanoparticles. Alternatively, it is also possible to cure of this layer after deposition the nanostructured layer that contains the reactive nanoparticles as explained in the following.

For the generation of the nanostructured layer containing the reactive nanoparticles capable of interacting with moisture and/oxygen, commercially available nanoparticles (NanoDur 99.5% aluminium oxide particles from Nanophase Technologies) were pre-treated with plasma and added to an organic solvent such as 2-methoxyethanol (2MOE) and ethylene glycol (EG) for dispersion in the ratio of 1:1 2MOE to EG. Propylene glycol monomethyl ether or Ethyl Acetate or Methyl Isobutyl Ketone, Methyl Ethyl, 2 MOE or any mixture of solvents or wetting additive agents can also be used instead. Alternatively, commercially available nanoparticle dispersions such as zinc oxide, or titanium oxide dispersed in hexane diol diacrylate, isobornyl acrylate, tripropylene glycol diacrylate can, for example, also be used.

A compound with polymerizable groups such as commercially available UV curable acrylate monomers (such as HC-5607 obtainable from Addison Clear Wave, Wooddale, Ill., USA, for example) was added to the nanoparticle mixture to form a sealing solution. The polymer coating weight may be between an amount of 5% to 70% by weight of the entire sealing solution. For example, the total concentration of nanoparticles in the polymer may be at 66% by weight of the sealing solution, while polymer coating weight is at about 34% by weight of the sealing solution.

The synthesis was undertaken under inert gas environment. The set of experiments were carried out with different mixtures of nanoparticles in acrylic polymer solutions and spin coated onto the plain polymer substrate.

Deposition of reactive aluminum oxide nanoparticles dispersed acrylic polymer (Hard coat).

Figure 12D:
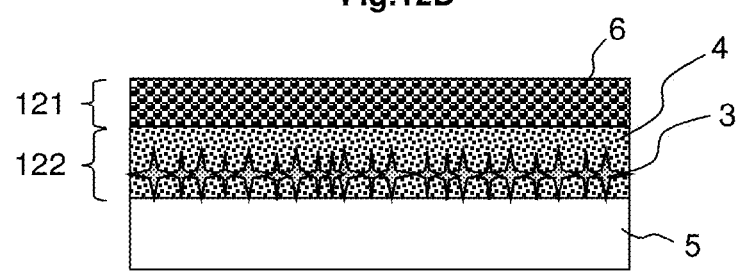

B3—the Cover Substrate Coated with UV Filter and Uncured Reactive Nanoparticle Dispersed Acrylic Polymer 6 (FIG. 12D).

For the deposition of the reactive nanoparticles (and thus formation of the respective film) of the UV neutralizing layer) 40 ml of UV curable acrylate monomer with a coating weight of about 1000% of the sealing solution was added to 15 ml of a dispersion of aluminum oxide in tripropylene glycol diacrylate (35% weight), obtainable from BYK Chemicals. 15 ml of an organic solvent of PGME and EG (1:1) ratio was added to the mixture. Sonification of the mixture was then carried out for about 1 hour prior to deposition onto a barrier oxide layer. The formation of the sealing layer via spin coating was undertaken in a nitrogen atmosphere in a glove box. The oxygen and water vapor contents were reduced to less than 1 ppm level in the glove box.

Figure 12E:
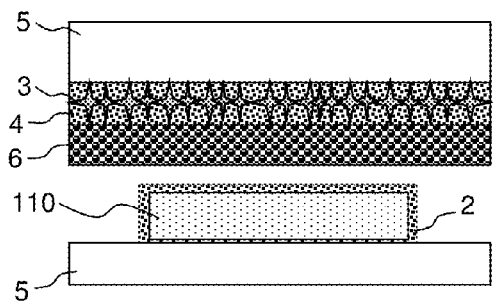
Figure 12F:
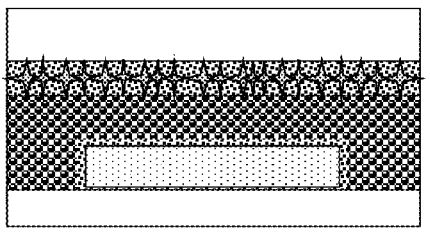

When testing the UV filter properties of a barrier film that contained the zinc nanorods in the UV light neutralizing layer and aluminum nanoparticles in the nanostructured film with a barrier film that only contained the initial seed layer of the zinc oxide particles in the UV light neutralizing layer, it was seen the UV filter properties of the zinc nanorods containing film was significantly higher (FIGS. 12E & F). In this context it is noted that the zinc nanorods can efficiently scatter the light, which enables the UV neutralizing layer to efficiently extract the light from device of interest, for example, an organic top emitting device.

Coating Transfer Process by Vacuum Sealing or Lamination Process

The cover substrate (B3) coated with the UV light neutralizing layer and the uncured nanostructured barrier layer is then sealed onto an organic device by vacuum sealing method ad then cured with UV radiation. Thereby an encapsulated electronic device such as an OLED, as illustrated in FIG. 13 is fabricated.

Flexible OLED Encapsulation—Fabrication of Prototype and Performance Testing of OLED Encapsulated with Barrier Film of the Invention Either glass or polycarbonate substrates are transparent and can be cut into preferred dimensions. Pneumatically operated hollow die punch-cutting equipment or any conventional slitting machine can be used to slit the polycarbonate substrates into the specified or required dimensions.

In the experimental setup, the substrates were rinsed with isopropyl alcohol (IPA) and blow-dried with nitrogen to remove macro-scale adsorbed particles on the surface. After nitrogen blow-dry, the substrates were placed in the vacuum oven at a pressure of $10^{-1}$ mbar (0.04 Pa) for degassing absorbed moisture or oxygen. Immediately after the degassing process, the substrates were transferred to the plasma treatment chamber (e.g. ULVAC SOLCIET Cluster Tool). RF argon plasma was used to bombard the surface of the barrier film with low energy ions in order to remove surface contaminants. The base pressure in the chamber was maintained below $4\times10^{-6}$ mbar. The argon flow rate was 70 seem (seem=cubic centimeters per minute at standard temperature and pressure) (0.1 Pa*m$^3$/s). The RF power was set at 200 W and an optimal treatment time usually 5 to 8 eight minutes is used depending on the surface condition. Poly (styrene sulfonate)-doped poly (3,4-ethylene dioxythiophene) (PEDOT) was used as a hole transport layer (HTL). The commercial phenyl-substituted poly (p-phenylenevinylene) (PPV) yellow light emitting polymer was used. A 20 nm thick calcium film covered with a 200 nm thick silver cathode was deposited by thermal evaporation in an ULVAC cluster system at a base pressure of $2.0\times10^{-6}$ Torr (0.0002666 Pa). The silver film was used to protect the underlying calcium. Also a small molecule based OLED structure was fabricated for the some of the encapsulation studies. In this fabrication process, ITO-coated glass with a sheet resistance of 20 Ω/square was used as a substrate for the OLED device fabrication. 75 nm NPB was deposited in high vacuum 2×10-5 Pa at 270° C. Then, 65 nm thick electroluminescence layer Alq3 was deposited at 270° C. under high vacuum of $2\times10^{-5}$ Pa pressure. LiF was deposited at 650° C. as an interlayer between EL and cathode. The cathode (200 nm aluminum) was deposited using thermal evaporation technique.

The standard small molecule based standard OLED device fabrication process was followed using 5 cm by 5 cm of the plastic substrate coated with barrier silicon oxide and ITO films and encapsulated with magnesium oxide thin film with 250 µm as solvent protection layer.

A zinc oxide nanoparticles containing polymer layer as described above was deposited onto the cover plastic substrate and used as UV light neutralizing layer (UV filter). In addition, also a nanostructured polymer layer containing aluminum oxide nanoparticles was deposited onto the UV filter. Before curing, the cover substrate was vacuum sealed on to the OLED device.

The flexibility of an organic light emitting device is limited to a great extent by the de-lamination nanostructure layer, indium tin oxide and interfacial effects of active polymer and hole and electron injection layers.

Figure 13A:
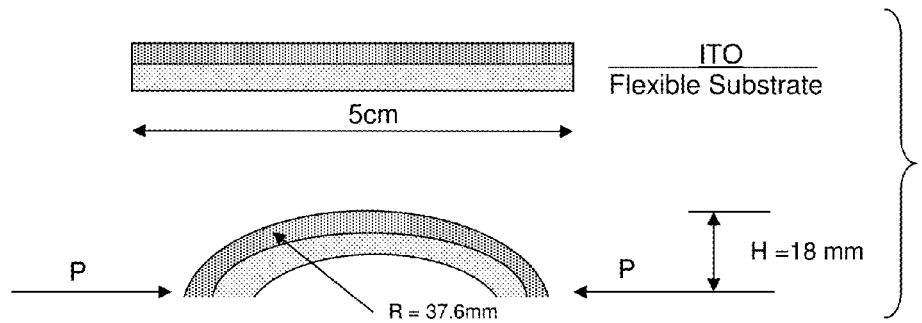
FIG. 13A depicts a schematic drawing of the bending test carried out with encapsulated OLED according to the invention.
Figure 13B:
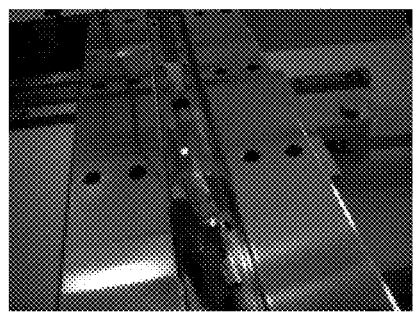
FIG. 13B is a photograph of the experimental set up for the bending test.
Figure 13C:
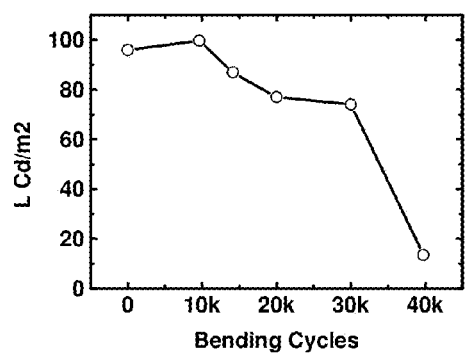
FIG. 13C shows the results of the performance test of the encapsulated OLED.

The flexible encapsulated OLED device according to the invention was subjected to different cycles of flexing as per American Society of Testing Materials Standard (radius of curvature: 30 mm, frequency: 50 Hz and the thickness of display <400 mm). The flexing test chosen were 5000, 10000, 20000 & 30000 cycles. The substrate was 5 cm by 5 cm as shown in FIG. 13a (cf. also FIG. 13B), the flexing radius of curvature R was 37.6 mm and deflection h was 18 mm as shown in FIG. 13A. Before and after each bending test the device luminescence was measured against voltage. FIG. 13C shows the luminescence against bending cycle's characteristics of flexed device performances with different bending cycles. The turn on voltage is 5V for flexed devices with 5 k bending cycles and the luminescence has reached up to 100 Cd/m$^2$. There was no interfacial failure between encapsulation and OLED, base and cover substrates. However, when the bending cycles increased beyond 10,000 cycles, the luminescence dropped to 80 Cd/m$^2$. The cover substrate bonding with nanostructured layer and UV filter was however still maintained. It was observed that the bonding between the solvent protection layer and OLED was still good and there no delamination occurred. In contrast thereto, the delamination in between the solvent protection layer and OLED occurred after the 30,000 bending cycles. This results show that vacuum sealing method resulted in a strong attachment of the barrier film of the invention to the OLED and vacuum sealing was able resolve the problems related to the bubbles formation and other defects due to the manual sealing methodologies.

Encapsulation of a Photovoltaic Device

In the following section an example of encapsulation of a photovoltaic device is described in more detail.

Encapsulation of a photovoltaic device as shown in FIG. 14 starts from the bottom of the device shown in FIG. 14. When the optional combination of layers 380 is not included, at first a base substrate (not shown) such as poly(ethylene-2,6-naphthalene dicarboxylate) (PEN), poly-ethylene terephthalate) (PET), poly(4-methyl-2-pentyne), polyimide, polycarbonate (PC) is provided which is then coated with the UV neutralizing layer 202 followed by the nanostructured layer 203. The barrier properties of this multilayer can be between about $10^{-1}$ g/m$^2$/day to about $10^{-6}$ g/m$^2$/day at 39° C. & 90% relative humidity (RH).

The UV neutralizing layer 202 and the nanostructured layer 203 can be coated on the substrate layer by deposition methods known in the art, such as spin coating, slot die coating, vacuum evaporation or screen printing, to name only a few. These layers can be cured by either heat curing or UV curing methods known in the art. It is also possible to coat the substrate layer on both sides with a UV neutralizing layer 202 to obtain a protection of the substrate layer, too.

The thickness of the UV neutralizing layer 202 and the nanostructured layer 203 can be between about 20 nm to about 1 µm or between about 500 nm and 1 µm. In general the thickness of the UV neutralizing layer 202 and the nanostructured layer 203 depends on the thickness of the encapsulated photovoltaic device 221. The ratio between the thickness of the photovoltaic device 221 and the neutralizing layer 202 and the nanostructured layer 203, respectively, is about 1:2. For example, a photovoltaic device 221 with a thickness of 1 μm results in a thickness of each of the UV neutralizing layer 202 and the nanostructured layer 203 of 2 μm.

The substrate layer coated with the UV neutralizing layer 202 and the nanostructured layer 203 is then laminated to the bottom of the photovoltaic device 221. Preparation of the layered structure on the other side of the photovoltaic device is carried out in the same way as at the bottom of the photovoltaic device 221.

However, before encapsulating the photovoltaic device 221 between layers 203 and 202 coated onto the substrate, the backing structure (also called sealing layer) is applied at the side of a photovoltaic device 221. In one embodiment, the backing structure consists of a nanostructured layer and/or adhesive layer and can be applied via standard printing methods (for more details regarding the formation of the backing structure see the following paragraphs). The width of the backing structure can be between about 1 μm to about 5 mm.

The adhesive layer(s) can be applied using a slot die coating process.

FIG. 15 shows a specific embodiment of the structure in FIG. 14 in which the encapsulated photovoltaic device is a Dye-sensitized solar cell (DSSC). The DSSC consists of a indium tin oxide layer 410, an electrolyte layer 420, a titanium oxide+dye layer 430 and a titanium foil layer 440.

For encapsulation of the DSSC with the multilayer barrier film as shown in FIG. 15, the DSSC is formed directly on the multilayer barrier film. At first, the titanium foil 440 is laminated onto the nanostructured layer 203. On top of the titanium foil, the titanium oxide paste is sputtered. To obtain the final titanium oxide/dye layer 430, titanium oxide paste is emerged in a solution of organic dye for a certain period of time.

Sputtering of the titanium oxide paste onto the titanium foil leaves a protrusion in the layer 430 in shape of a crescent. After emerging and drying of the electrode the electrolyte is filled into this protrusion. The electrolyte layer 420 and the nanostructured layer forming the backing structure are created at the same time, for example by any standard printing method known in the art. The backing structure is cured by applying UV light only at the point where the backing structure is located.

Following formation of the electrolyte layer 420 and the backing structure, the ITO layer 410 is laminated on top of the electrolyte layer 420.

What is claimed is:

1. A method of fabricating an encapsulated electronic device, comprising:
providing a vacuum enclosure,
arranging within the vacuum enclosure a base substrate having arranged thereon an electronic device to be encapsulated, and
forming a multilayer barrier film on the electronic device, the multilayer barrier film capable of encapsulating a moisture and/or oxygen sensitive electronic or optoelectronic device, and comprising: at least one nanostructured layer comprising reactive nanoparticles capable of interacting with moisture and/or oxygen, and inert nanoparticles which do not interact with moisture and/or oxygen and which are adapted to obstruct the permeation of moisture and/or oxygen, said reactive nanoparticles and inert nanoparticles being distributed within a polymeric binder, and at least one ultraviolet light neutralizing layer comprising a material capable of absorbing ultraviolet light, thereby limiting the transmission of ultraviolet light through the multilayer barrier film on the electronic device, thereby encapsulating the electronic device, wherein forming the multilayer barrier film on the electronic device comprises:
forming a first layer comprising a material capable of absorbing ultraviolet light on the electronic device, the first layer constituting the ultraviolet light neutralizing layer,
mixing reactive nanoparticles capable of interacting with moisture and/or oxygen and inert nanoparticles which do not interact with moisture and/or oxygen and which are adapted to obstruct the permeation of moisture and/or oxygen with a polymerizable compound having at least one polymerizable group to form a nanoparticulate mixture,
applying the nanoparticulate mixture on the first layer formed on the electronic device, and
exposing the nanoparticulate mixture to ultraviolet light to cure the nanoparticulate mixture during which the first layer functions to limit the transmission of the ultraviolet light onto the electronic device, thereby forming a second layer constituting the nanostructured layer on the first layer.

2. The method of claim 1, further comprising the step of forming a secondary encapsulation over the electronic device encapsulated by the multilayer barrier film,
wherein the multilayer film encapsulating the electronic device is contacted with a curable adhesive in an amount sufficient to surround the electronic device encapsulated by the multilayer barrier film,
attaching a cover substrate on the adhesive prior to compressing the adhesive against the electronic device encapsulated by the multilayer barrier film,
mechanically compressing the cover substrate against the adhesive at an elevated temperature, and
curing the adhesive.

* * * * *